United States Patent
Sasaki et al.

(10) Patent No.: US 9,269,318 B2
(45) Date of Patent: Feb. 23, 2016

(54) DISPLAY DEVICE

(71) Applicant: Sharp Kabushiki Kaisha, Osaka-shi, Osaka (JP)

(72) Inventors: Yasushi Sasaki, Osaka (JP); Yuhichiroh Murakami, Osaka (JP); Takahiro Yamaguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/379,508

(22) PCT Filed: Feb. 28, 2013

(86) PCT No.: PCT/JP2013/055336
§ 371 (c)(1),
(2) Date: Aug. 19, 2014

(87) PCT Pub. No.: WO2013/146058
PCT Pub. Date: Oct. 3, 2013

(65) Prior Publication Data
US 2015/0015558 A1  Jan. 15, 2015

(30) Foreign Application Priority Data

Mar. 30, 2012 (JP) ................................ 2012-080597

(51) Int. Cl.
*G09G 3/36* (2006.01)
*G11C 19/28* (2006.01)

(52) U.S. Cl.
CPC .............. *G09G 3/3677* (2013.01); *G11C 19/28* (2013.01); *G09G 2310/0245* (2013.01); *G09G 2310/0286* (2013.01); *G09G 2320/0257* (2013.01); *G09G 2330/021* (2013.01); *G09G 2330/025* (2013.01); *G09G 2330/04* (2013.01)

(58) Field of Classification Search
CPC ..................... G09G 3/3677; G09G 2310/0245; G09G 2310/0286; G09G 2320/0257; G09G 2330/021; G09G 2330/025; G09G 2330/04; G11C 19/28
USPC ........................... 345/100, 204-214, 690-699
See application file for complete search history.

(56) References Cited

U.S. PATENT DOCUMENTS

| 2002/0089482 | A1* | 7/2002 | Hanzawa | G09G 3/3696 345/92 |
| 2005/0127998 | A1* | 6/2005 | Maekawa | H03F 3/45237 330/253 |
| 2008/0238852 | A1* | 10/2008 | Tsai | G09G 3/20 345/98 |
| 2010/0182305 | A1* | 7/2010 | Fang | G09G 3/3677 345/212 |
| 2011/0001732 | A1* | 1/2011 | Morii | G09G 3/3677 345/204 |
| 2012/0218245 | A1 | 8/2012 | Morii et al. | |

FOREIGN PATENT DOCUMENTS

| JP | 2002-197885 A | 7/2002 |
| WO | 2009/028353 A1 | 3/2009 |
| WO | 2011/055584 A1 | 5/2011 |

OTHER PUBLICATIONS

Official Communication issued in International Patent Application No. PCT/JP2013/055336, mailed on Jun. 4, 2013.

* cited by examiner

*Primary Examiner* — Dmitriy Bolotin
(74) *Attorney, Agent, or Firm* — Keating & Bennett, LLP

(57) ABSTRACT

The purpose of the present invention is to achieve a display device capable of performing an all-selecting drive for gate bus lines without increasing the number of circuit elements more than heretofore and without lowering withstand voltage reliability. In a stage constituent circuit, which constitutes a shift register in a gate driver, an all-selecting signal (ALL-ON) for simultaneously turning all of gate bus lines to a selected state is given, as a low-potential power supply, to a source terminal of a thin film transistor (Tr4) for setting, at a low level, a QB node provided for setting a scanning signal (OUT) at the low level and to a source terminal of a thin film transistor (Tr3) for setting, at the low level, a Q node provided for setting the scanning signal (OUT) at a high level. A wiring (ALL-ON wiring) for supplying a low-potential power supply to the gate driver and a wiring (VSS wiring) for supplying the low-potential power supply to a circuit other than the gate driver are power supply wirings independent of each other.

13 Claims, 21 Drawing Sheets

DISPLAY DEVICE

TECHNICAL FIELD

The present invention relates to a display device, and more specifically, to a display device having a function to simultaneously activate all of scanning signal lines.

BACKGROUND ART

In general, an active matrix-type liquid crystal display device includes a liquid crystal panel composed of two substrates which sandwich a liquid crystal layer therebetween. On one substrate of the two substrates, a plurality of gate bus lines (scanning signal lines) and a plurality of source bus lines (video signal lines) are arranged in a grid shape, and there are provided a plurality of pixel formation portions arranged in a matrix shape so as to individually correspond to intersections of the plurality of gate bus lines and the plurality of source bus lines. Each of the pixel formation portions includes: a thin film transistor (TFT) that is a switching element in which a gate terminal is connected to the gate bus line passing through the intersection corresponding thereto and a source terminal is connected to a source bus line passing through the intersection concerned; a pixel capacitance for holding a pixel value; and the like. Moreover, on other substrate of the above-described two substrates, a common electrode that is a counter electrode provided commonly to the plurality of pixel formation portions is provided. In the active matrix-type liquid crystal display device, there are further provided: a gate driver (a scanning signal line drive circuit) that drives the plurality of gate bus lines; and a source driver (a video signal line drive circuit) that drives the plurality of source bus lines.

Video signals, each of which indicates the pixel value, are transmitted by the source bus lines; however, each of the source bus lines cannot transmit video signals indicating pixel values for a plurality of rows at a time (simultaneously). Therefore, writing of the video signals to the pixel capacitances in the above-mentioned pixel formation portions arranged in the matrix shape is sequentially performed one row by one row. Accordingly, the gate driver is constituted by a shift register, which is formed of a plurality of stages, so that the plurality of gate bus lines can be sequentially selected every predetermined period. Then, active scanning signals are sequentially outputted from the respective stages of the shift register (hereinafter, circuits which constitute the respective stages of the shift register are also referred to as "stage constituent circuits"), whereby the writing of the video signals to the pixel capacitances is sequentially performed one row by one row as mentioned above.

In the liquid crystal display device as described above, in some case, though a power supply thereof is turned off by a user, display is not cleared immediately, and an image like an afterimage remains. A reason for this is because, when the power supply of the device is turned off, a discharge path of electric charges held in each of the pixel capacitances is shut off, and residual electric charges are accumulated in each of the pixel formation portions. Moreover, when the power supply of the device is turned on in a state where the residual electric charges are accumulated in each of the pixel formation portions, then there occurs a deterioration in display quality, such as an occurrence of a flicker caused by a bias of impurities, the bias being based on the residual electric charges.

Accordingly, a liquid crystal display device is proposed, which is configured so that the residual electric charges in all of the pixel formation portions can be discharged by turning all of the gate bus lines into a selected state (active state) at the time of turning off the power supply and turning on the power supply (refer to WO 2009/028353). Note that a drive to turn all of the gate bus lines into the selected state is hereinafter referred to as an "all-selecting drive".

In the liquid crystal display device disclosed in WO 2009/028353, a schematic configuration of the gate driver is as shown in FIG. 16. As mentioned above, the gate driver is constituted by the shift register made of the plurality of stages. Note that, in FIG. 16, stage constituent circuits SR(n−1) to SR(n+2) from an (n−1)-th stage to an (n+2)-th stage are shown. To each of the stage constituent circuits, there are inputted a set signal S, a reset signal R, a clock signal CK (one of a first gate clock signal GCK1 and a second gate clock signal GCK2), and an all-selecting signal ALL-ON. The set signal S is a signal for activating the stage constituent circuit, and the reset signal R is a signal for inactivating the stage constituent circuit. Moreover, a scanning signal OUT is outputted from each of the stage constituent circuits. The scanning signal OUT outputted from each of the stage constituent circuits is not only applied to the gate bus line corresponding thereto, but is also given as the set signal S to the stage constituent circuit on a subsequent stage, and is also given as the reset signal R to the stage constituent circuit on a preceding stage, as shown in FIG. 16. That is to say, the high-level scanning signal outputted from each of the stage constituent circuits activates the stage constituent circuit on the next stage, and inactivates the stage constituent circuit on the preceding stage. A schematic configuration of the stage constituent circuit is as shown in FIG. 17. In a logic unit, two signals (referred to as "Q signal" and "QB signal" for convenience) are generated. The Q signal controls a state of a switch SW1 in an output unit, and the QB signal controls a state of a switch SW2 in the output unit. From the output unit, the scanning signal OUT is outputted in accordance with states of the switch SW1, the switch SW2, the clock signal CK and the all-selecting signal ALL-ON.

In such a configuration as described above, at a usual time, the all-selecting signal ALL-ON is maintained at a low level (refer to FIG. 18). During the usual time, when the stage constituent circuit is inactive, the Q signal is at the low level, and the QB signal is at the high level. In this way, the switch SW1 turns to an OFF state, and the switch SW2 turns to an ON state, and accordingly, the scanning signal OUT turns to the low level. Meanwhile, during the usual time, when the stage constituent circuit is active, the Q signal is at the high level, and the QB signal is at the low level. In this way, the switch SW1 turns to the ON state, and the switch SW2 turns to the OFF state, and accordingly, the scanning signal OUT is at the high level during a period while the clock signal CK is being at the high level. From the above, at the usual time, clock signals (first gate clock signal GCK1 and second gate clock signal GCK2) having waveforms as shown in FIG. 18 are given to the gate driver, whereby the scanning signals outputted from the plurality of stage constituent circuits, which constitute the shift register in the gate driver, sequentially turn to the high level every predetermined period. Incidentally, if the all-selecting signal ALL-ON turns to the high level at the time when the switch SW1 is in the OFF state and the switch SW2 is in the ON state, then the scanning signal OUT outputted from this stage constituent circuit turns to the high level. Hence, when it is desired that the all-selecting drive be performed, the all-selecting signal ALL-ON is set at the high level, whereby all of the scanning signals can be set at the high level as shown in FIG. 18 in a state where the respective stage constituent circuits are inactive. In the way as described above, the residual electric charges in all of the pixel formation portions in the display unit are removed.

PRIOR ART DOCUMENT

Patent Document

[Patent Document 1] WO 2009/028353

SUMMARY OF THE INVENTION

Problems to be Solved by the Invention

However, according to the prior art, in some case, a voltage exceeding a withstand voltage (limit voltage at which a dielectric breakdown does not occur) is applied to thin film transistors in the stage constituent circuit when the all-selecting drive is performed, and reliability is lowered. A description thereof is made below.

FIG. 19 is a view showing a configuration example of the conventional stage constituent circuit. This stage constituent circuit includes six thin film transistors Tr91 to Tr96. Moreover, this stage constituent circuit includes four input terminals 91 to 94 and one output terminal 99 as well as an input terminal for a high-potential power supply. Reference numeral 91 is assigned to an input terminal that receives the all-selecting signal ALL-ON, reference numeral 92 is assigned to an input terminal that receives the clock signal CK, reference numeral 93 is assigned to an input terminal that receives the set signal S, and reference numeral 94 is assigned to an input terminal that receives the reset signal R. Note that a region (wiring) where a source terminal of the thin film transistor Tr91, a drain terminal of thin film transistor Tr93 and a gate terminal of the thin film transistor Tr95 are connected to one another is referred to as a "Q node" for convenience. Moreover, a region (wiring) where a source terminal of the thin film transistor Tr92, a gate terminal of the thin film transistor Tr93, a drain terminal of the thin film transistor Tr94 and a gate terminal of the thin film transistor Tr96 are connected to one another is referred to as a "QB node" for convenience.

While referring to FIG. 19 and a portion A of FIG. 20, a description is made of an operation of the conventional stage constituent circuit at the usual time. Note that a period from a point of time t3 to a point of time t4 in FIG. 20 is assumed to be a period in which the gate bus line connected to this stage constituent circuit should be selected. Moreover, the input terminal 92 of this stage constituent circuit is assumed to be given the first gate clock signal GCK1.

In a period before a point of time t1, a potential of the Q node is maintained at the low level, and a potential of the QB node is maintained at the high level. When the point of time t1 comes, and the set signal S is changed from the low level to the high level, the thin film transistors Tr91 and Tr94 turn to the ON state. By the fact that the thin film transistor Tr91 turns to the ON state, the potential of the Q node is changed from the low level to the high level. Moreover, by the fact that the thin film transistor Tr94 turns to the ON state, the potential of the QB node is changed from the high level to the low level.

When the point of time t3 comes after the set signal S is changed from the high level to the low level at a point of time t2, the first gate clock signal GCK1 is changed from the low level to the high level. At this time, the thin film transistor Tr95 is in the ON state, and accordingly, a potential of the output terminal 99 (a potential of the scanning signal OUT) rises together with a rise of a potential of the input terminal 92. Parasitic capacitances are present between a gate and source of the thin film transistor Tr95 and between the gate and drain thereof, and accordingly, the potential of the Q node also rises (Q node is boot-strapped) together with the rise of the potential of the output terminal 99. As a result, the potential of the Q node becomes "VDD×2−Vth" (Vth is a threshold voltage of the thin film transistor Tr91). In this way, a large voltage is applied to the gate terminal of the thin film transistor Tr95, and the potential of the output terminal 99 rises to a high-level potential of the first gate clock signal GCK1 without causing a so-called threshold voltage drop (matter that a source potential rises only up to a potential lower by an amount of the threshold voltage in comparison with the drain potential). As described above, the gate bus line connected to the output terminal 99 of this stage constituent circuit turns to the selected state.

As mentioned above, the potential of the Q node rises significantly by a boot strap. Therefore, the voltage exceeding the withstand voltage is sometimes applied between the drain and source of the thin film transistor Tr93. Accordingly, the thin film transistor Tr97 is provided between the gate terminal of the thin film transistor Tr95 and the drain terminal of the thin film transistor Tr93 as shown in FIG. 21, whereby the voltage exceeding the withstand voltage is suppressed from being applied to the thin film transistor Tr93. This is because the thin film transistor Tr97 functions as voltage dividing means, and even when the potential of the Q node becomes higher than VDD, the potential of the Q2 node connected to the drain terminal of the thin film transistor Tr93 does not become higher than VDD.

Next, while referring to FIG. 19 and a portion B of FIG. 20, a description is made of an operation of the conventional stage constituent circuit at the time of the all-selecting drive. Note that a period from a point of time t11 to a point of time t12 in FIG. 20 is assumed to be a period in which all of the gate bus lines should be turned to the selected state. In a period before the point of time t11, the potential of the Q node is at the low level, and the potential of the QB node is at the high level. When the point of time t11 comes, the all-selecting signal ALL-ON is changed from the low level to the high level. At this time, the potential of the QB node rises from VDD to "VDD×2−Vth" by a boot strap caused by a parasitic capacitance of the thin film transistor Tr96. In this way, a large voltage is applied to the gate terminal of the thin film transistor Tr96, and the potential of the output terminal 99 (the potential of the scanning signal OUT) rises to the potential of the all-selecting signal ALL-ON without causing the so-called threshold voltage drop. Such an operation as described above is performed in all of the stage constituent circuits, and all of the gate bus lines turn to the selected state in the period from the point of time t11 to the point of time t12.

Incidentally, the potentials of the source terminals of the thin film transistor Tr93 and the thin film transistor Tr94 are VSS, and accordingly, it is apprehended that the voltage exceeding the withstand voltage may be applied to the thin film transistor Tr93 and the thin film transistor Tr94 in the period from the point of time t11 to the point of time t12. When the voltage exceeding the withstand voltage is applied to the thin film transistors in each of the stage constituent circuits, the reliability of the circuit is lowered. Accordingly, it is considered to provide a thin film transistor Tr98 between the gate terminal of the thin film transistor Tr96 and the drain terminal of the thin film transistor Tr94 as shown in FIG. 22. However, the number of circuit elements in the stage constituent circuit is increased, and accordingly, miniaturization and cost reduction become difficult.

It is an object of the present invention to realize a display device capable of performing the all-selecting drive for the gate bus lines without increasing the number of circuit elements more than heretofore and without lowering the withstand voltage reliability.

Means for Solving the Problems

A first aspect of the present invention is directed to a display device comprising a display panel which includes a display unit in which a plurality of scanning signal lines and a plurality of video signal lines are arranged, a scanning signal line drive circuit that drives the plurality of scanning signal lines, and a video signal line drive circuit that drives the plurality of video signal lines, wherein
the display panel includes: a first first-potential power supply wiring for supplying a first-potential power supply to the scanning signal line drive circuit; and a second first-potential power supply wiring for supplying the first-potential power supply to circuits other than the scanning signal line drive circuit,
the scanning signal line drive circuit includes a shift register made of a plurality of stages for sequentially outputting ON-level scanning signals to the plurality of scanning signal lines based on a clock signal,
a stage constituent circuit that constitutes each of the stages of the shift register includes:
an output node connected to one of the scanning signal lines;
an output control node for controlling a potential of a scanning signal outputted from the output node; and
an output control node turn-off switching element in which a second electrode is connected to the output control node and a third electrode is connected to the first first-potential power supply wiring, the output control node turn-off switching element serving for changing a potential of the output control node toward an OFF level based on a potential of a first electrode,
the output control node is configured to be capable of being given a potential higher than a potential of a second-potential power supply supplied to the scanning signal line drive circuit in a case where the potential of the second-potential power supply supplied to the scanning signal line drive circuit is higher than a potential of the first-power supply supplied to the scanning signal line drive circuit,
the output control node is configured to be capable of being given a potential lower than the potential of the second-potential power supply supplied to the scanning signal line drive circuit in a case where the potential of the second-potential power supply supplied to the scanning signal line drive circuit is lower than the potential of the first-power supply supplied to the scanning signal line drive circuit, and
the first first-potential power supply wiring and the second first-potential power supply wiring are power supply wirings independent of each other.

According to a second aspect of the present invention, in the first aspect of the present invention,
the stage constituent circuit includes:
an output node turn-off switching element in which a second electrode is connected to the output node and a third electrode is connected to the first first-potential power supply wiring, the output node turn-off switching element serving for changing a potential of the output node toward the OFF level based on the potential of a first electrode;
a first control node connected to the first electrode of the output node turn-off switching element, the first control node serving as the output control node;
a first control node turn-on portion for changing a potential of the first control node toward the ON level; and a first control node turn-off switching element in which a second electrode is connected to the first control node and a third electrode is connected to the first first-potential power supply wiring, the first control node turn-off switching element serving for changing the potential of the first control node toward the OFF level based on a potential of a first electrode, and serving as the output control node turn-off switching element.

According to a third aspect of the present invention, in the second aspect of the present invention,
the stage constituent circuit further includes:
an output node turn-on switching element in which a second electrode is given the clock signal and a third electrode is connected to the output node, the output node turn-on switching element serving for changing the potential of the output node toward the ON level based on a potential of a first electrode;
a second control node connected to the first electrode of the output node turn-on switching element, the second control node serving as the output control node;
a second control node turn-on portion for changing a potential of the second control node toward the ON level; and
a second control node turn-off switching element in which a second electrode is connected to the second control node directly or through voltage dividing means and a third electrode is connected to the first first-potential power supply wiring, the second control node turn-off switching element serving for changing the potential of the second control node based on a potential of a first electrode, and serving as the output control node turn-off switching element, and
the first electrode of the second control node turn-off switching element is connected to the first control node.

According to a fourth aspect of the present invention, in the third aspect of the present invention,
the scanning signal line drive circuit is configured to be capable of an all-selecting drive of outputting the ON-level scanning signals to all of the plurality of scanning signal lines,
an all-selecting signal controlling whether or not to perform the all-selecting drive is given to the first first-potential power supply wiring,
the second control node turn-on portion included in the stage constituent circuit changes the potential of the second control node toward the ON level based on a start instruction signal or a scanning signal outputted from the output node on a preceding stage,
the start instruction signal or the scanning signal outputted from the output node on the preceding stage is given to the first electrode of the first control node turn-off switching element included in the stage constituent circuit, and
the all-selecting signal, the clock signal and the start instruction signal are set at the ON level at a time of the all-selecting drive.

According to a fifth aspect of the present invention, in the third aspect of the present invention,
the stage constituent circuit includes, as the voltage dividing means, a voltage-dividing switching element in which a first electrode is given a high-potential power supply, a second electrode of the second control node turn-off switching element is connected to a second electrode, and the first electrode of the output node turn-on switching element is connected to a third electrode.

According to a sixth aspect of the present invention, in the third aspect of the present invention,
the shift register is configured so that an order of giving the plurality of scanning signal lines the ON-level scanning signals can be switched between a forward order and a reverse order, the stage constituent circuit is given a switching control signal which is changed between the ON level and the OFF level, the switching control signal serving for switching the order of giving the plurality of scanning signal lines the ON-level scanning signals, the second control node turn-on portion included in the stage constituent circuit is composed of:

a second control node turn-on switching element in which a second electrode is given a high-potential power supply and a third electrode is connected to the second control node directly or through the voltage dividing means, the second control node turn-on switching element serving for changing the potential of the second control node toward the ON level based on a potential of a first electrode;

a fourth control node connected to the first electrode of the second control node turn-on switching element; and a second switch-control switching element in which a first electrode is given the switching control signal, a second electrode is given a scanning signal outputted from the output node of other stage, and a third electrode is connected to the fourth control node, and a signal line for giving the switching control signal an OFF-level potential is connected to the first first-potential power supply wiring.

According to a seventh aspect of the present invention, in the sixth aspect of the present invention, the first control node turn-on portion included in the stage constituent circuit is composed of:

a first control node turn-on switching element in which a second electrode is given the high-potential power supply and a third electrode is connected to the first control node, the first control node turn-on switching element serving for changing the potential of the first control node toward the ON level based on a potential of a first electrode;

a third control node connected to the first electrode of the first control node turn-on switching element; and a first switch-control switching element in which a first electrode is given the switching control signal, a second electrode is given a scanning signal outputted from the output node of other stage, and a third electrode is connected to the third control node.

According to an eighth aspect of the present invention, in the sixth or seventh aspect of the present invention, the scanning signal line drive circuit is configured to be capable of an all-selecting drive of outputting the ON-level scanning signals to all of the plurality of scanning signal lines, an all-selecting signal controlling whether or not to perform the all-selecting drive is given to the first first-potential power supply wiring, and the all-selecting signal and the switching control signal are set at the ON level at a time of the all-selecting drive.

According to a ninth aspect of the present invention, in the second aspect of the present invention, the stage constituent circuit further includes an initialization switching element configured so that a second electrode is given a high-potential power supply, that a third electrode is connected to the first control node, and that a first electrode is given a predetermined initialization signal.

According to a tenth aspect of the present invention, in the ninth aspect of the present invention, the scanning signal line drive circuit is configured to be capable of an all-selecting drive of outputting the ON-level scanning signals to all of the plurality of scanning signal lines, an all-selecting signal controlling whether or not to perform the all-selecting drive is given to the first first-potential power supply wiring, and the all-selecting signal and the initialization signal are set at the ON level at a time of the all-selecting drive.

According to an eleventh aspect of the present invention, in the first aspect of the present invention, the scanning signal line drive circuit is configured to be capable of an all-selecting drive of outputting the ON-level scanning signals to all of the plurality of scanning signal lines, an all-selecting signal controlling whether or not to perform the all-selecting drive is given to the first first-potential power supply wiring, and the all-selecting signal is set at the ON level at a time of the all-selecting drive.

According to a twelfth aspect of the present invention, in the eleventh aspect of the present invention, the all-selecting drive is performed at a time of inspecting the display panel.

According to a thirteenth aspect of the present invention, in the eleventh aspect of the present invention, the display device further comprises a panel control circuit connected to the first first-potential power supply wiring, the panel control circuit serving for controlling an operation of the display panel, wherein the panel control circuit sets the all-selecting signal at the ON level when a supply of a power supply from an outside is started or shut off.

Effects of the Invention

In accordance with the first aspect of the present invention, in the display panel, there are provided: the first first-potential power supply wiring for supplying the first-potential power supply (a low-potential power supply in a case where n-channel type transistors are employed as the switching elements, a high-potential power supply in a case where p-channel type transistors are employed as the switching elements) to the scanning signal line drive circuit; and the second first-potential power supply wiring for supplying the first-potential power supply to the circuits other than the scanning signal line drive circuit. Moreover, each of the stage constituent circuits which constitute the shift register in the scanning signal line drive circuit includes: the output node; the output control node for controlling the potential of the scanning signal; and the output control node turn-off switching element for changing the potential of the output control node toward the OFF level. The third electrode of the output control node turn-off switching element is connected to the first first-potential power supply wiring. Here, the first first-potential power supply wiring and the second first-potential power supply wiring are independent of each other. Therefore, even when the potential of the power supply supplied by the first first-potential power supply wiring is changed in order to control the state of the scanning signal, an abnormal operation in circuits other than the scanning signal line drive circuit is not caused. Moreover, it becomes possible to also change the potential of the third electrode of the output control node turn-off switching element in response to the change of the potential of the output control node, and application of the voltage exceeding the withstand voltage to the output control node turn-off switching element is suppressed without increasing the circuit elements in comparison with heretofore.

In accordance with the second aspect of the present invention, in the display device with the configuration in which the switching elements and the nodes for turning the potential of the output node to the OFF level are provided in each of the stage constituent circuits which compose the shift register, lowering of withstand voltage reliability is suppressed without increasing the circuit elements in comparison with heretofore.

In accordance with the third aspect of the present invention, in the display device with the configuration in which the switching elements and the nodes for turning the potential of the output node to the ON level are provided in each of the stage constituent circuits which compose the shift register, lowering of withstand voltage reliability is suppressed without increasing the circuit elements in comparison with heretofore.

In accordance with the fourth aspect of the present invention, at the time of performing the all-selecting drive, since not only the all-selecting signal but also the clock signal and the start instruction signal turn to the ON level, application of the voltage exceeding the withstand voltage to each of the switching elements provided in the stage constituent circuits which constitute the shift register is surely suppressed.

In accordance with the fifth aspect of the present invention, when the potential of the second control node rises to a large extent, the potential of the second electrode of the second control node turn-off switching element can be suppressed from rising. In this way, application of the voltage exceeding the withstand voltage to the second control node turn-off switching element is suppressed.

In accordance with the sixth aspect of the present invention, in the display device capable of switching the scanning order of the scanning signal lines, similar effects to those of the first to third aspects are obtained.

In accordance with the seventh aspect of the present invention, in the display device capable of switching the scanning order of the scanning signal lines, similar effects to those of the first to third aspects are obtained.

In accordance with the eighth aspect of the present invention, in the display device capable of switching the scanning order of the scanning signal lines, at the time of performing the all-selecting drive, application of the voltage exceeding the withstand voltage to the switching element provided for switching the scanning order is suppressed.

In accordance with the ninth aspect of the present invention, it becomes possible to initialize each of the stage constituent circuits, which constitute the shift register, at desired timing.

In accordance with the tenth aspect of the present invention, at the time of performing the all-selecting drive, application of the voltage exceeding the withstand voltage to the switching element provided for initializing the shift register is suppressed.

In accordance with the eleventh aspect of the present invention, the display device can be realized, which is capable of performing the all-selecting drive for the scanning signal lines without increasing the number of circuit elements more than heretofore and without lowering the withstand voltage reliability.

In accordance with the twelfth aspect of the present invention, it becomes possible to allow the presence of the residual electric charges in the pixel formation portions not to affect an inspection result of the display panel.

In accordance with the thirteenth aspect of the present invention, the residual electric charges in the pixel formation portions are removed when the power supply is turned ON or the power supply is turned OFF, and accordingly, lowering of display quality, which is caused by the presence of the residual electric charges, is suppressed.

MODES FOR CARRYING OUT THE INVENTION

A description is made below of embodiments of the present invention while referring to the accompanying drawings. In the following description, a gate terminal (a gate electrode) of a thin film transistor corresponds to a first electrode, a drain terminal (a drain electrode) of the thin film transistor corresponds to a second electrode, and a source terminal (a source electrode) of the thin film transistor corresponds to a third electrode. Note that, in general, one of the source and the drain, which has a higher potential, is called the drain; however, in the following description, one is defined as the drain, and the other is defined as the source, and accordingly, such a source potential sometimes becomes higher than such a drain potential. Moreover, unless particularly specified, the description is made on the assumption that all of the thin film transistors provided in a shift register are of an n-channel type.

1. First Embodiment

1.1 Entire Configuration and Operation

Figure 2:
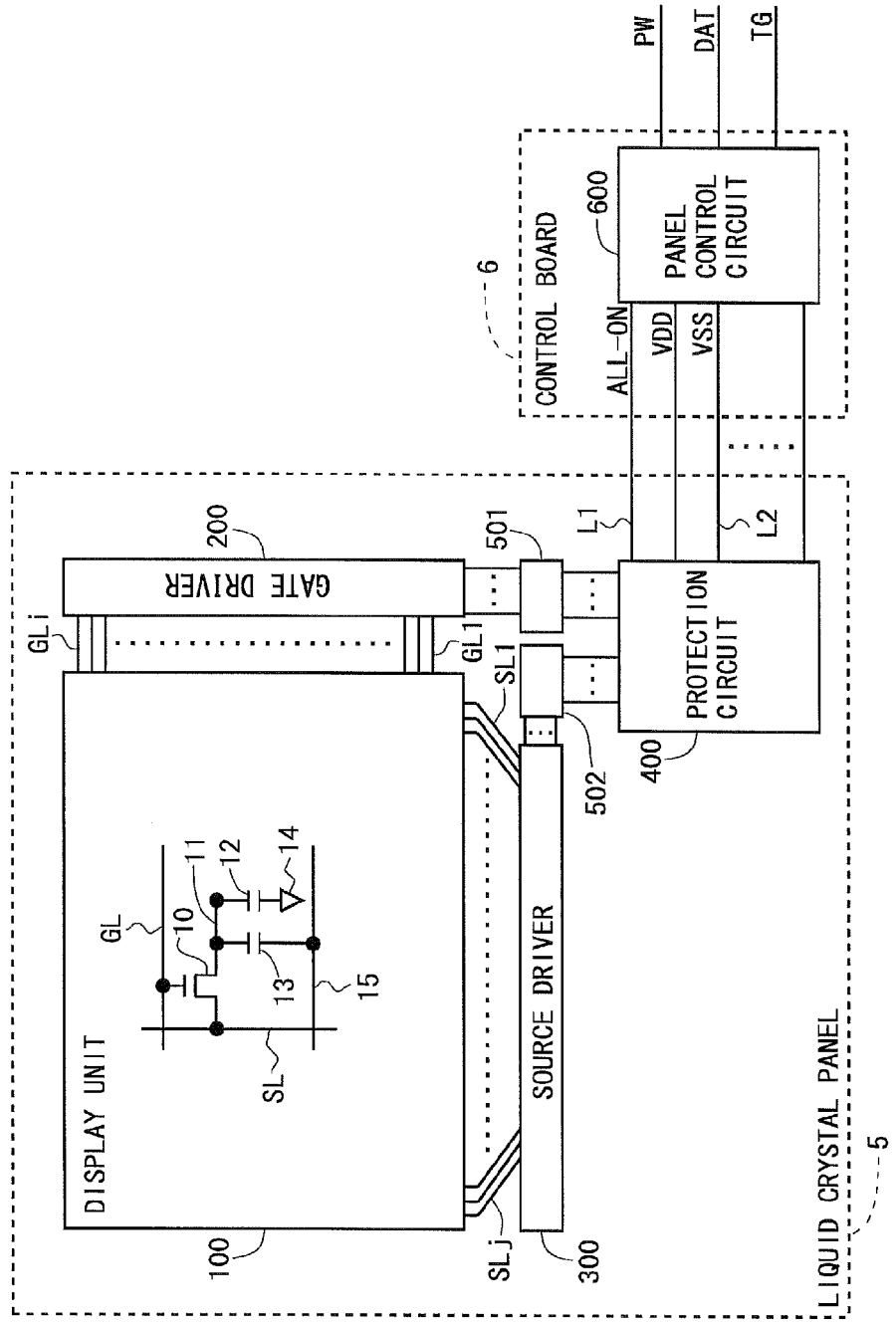
FIG. 2 is a block diagram showing an entire configuration of the liquid crystal display device in the first embodiment.

FIG. 2 is a block diagram showing an entire configuration of an active matrix-type liquid crystal display device according to a first embodiment of the present invention. This liquid crystal display device is constituted by a liquid crystal panel 5 and a control board 6. The liquid crystal panel 5 includes: a display unit 100; a gate driver (a scanning signal line drive circuit) 200; a source driver (a video signal line drive circuit) 300; a protection circuit 400 for protecting a circuit in the panel from static electricity; and control circuits 501 and 502 such as level shifters. The control board 6 includes a panel control circuit 600.

The display unit 100 includes: a plurality (j pieces) of source bus lines (video signal lines) SL1 to SLj; a plurality (i pieces) of gate bus lines (scanning signal lines) GL1 to GLi; and a plurality (i×j) of pixel formation portions provided so as to individually correspond to intersections of these source bus lines SL1 to SLj and these gate bus lines GL1 to GLi. Each of the pixel formation portions includes: thin film transistor (TFT) 10, in which a gate terminal is connected to the gate bus line GL passing through the intersection corresponding thereto, and a source terminal is connected to the source bus line SL passing through the intersection concerned; a pixel electrode 11 connected to a drain terminal of the thin film transistor 10; a common electrode 14 and an auxiliary capacitance electrode 15, which are commonly provided to the above-described plurality of pixel formation portions; a liquid crystal capacitance 12 formed of the pixel electrode 11 and the common electrode 14; and an auxiliary capacitance 13 formed of the pixel electrode 11 and the auxiliary capacitance electrode 15. Moreover, a pixel capacitance is formed of the liquid crystal capacitance 12 and the auxiliary capacitance 13. Then, based on a video signal which the source terminal of the thin film transistor 10 receives from the source bus line SL when the gate terminal of the thin film transistor 10 receives an active scanning signal from the gate bus line GL, a voltage indicating a pixel value is held in the pixel capacitance. Note that, in the display unit 100 of FIG. 2, only constituent elements corresponding to one pixel formation portion are shown.

The panel control circuit 600 receives a supply of a power supply PW, and generates a high-potential power supply VDD and a low-potential power supply VSS, which are required in the respective circuits of the liquid crystal panel 5, and in addition, generates an all-selecting signal ALL-ON. Moreover, the panel control circuit 600 receives an image signal DAT and a timing signal group TG such as a horizontal synchronization signal and a vertical synchronization signal, which are sent from an outside, and generates digital video signals (not shown) and various control signals (not shown) for controlling operations of the gate driver 200 and the source driver 300. The various control signals include: a gate start pulse signal and a gate clock signal, which control the operation of the gate driver 200; a source start pulse signal and a source clock signal, which control the operation of the source driver 300. The high-potential power supply VDD, the low-potential power supply VSS, the all-selecting signal ALL-ON, the digital video signals, and the various control signals, which are generated in the panel control circuit 600, are given through the protection circuit 400 to the circuits in the liquid crystal panel 5. Note that, for convenience of explanation, a wiring for supplying the all-selecting signal ALL-ON is referred to as an "ALL-ON wiring", and a wiring for supplying the low-potential power supply VSS is referred to as a "VSS wiring". In FIG. 2, reference symbol L1 is assigned to the ALL-ON wiring, and reference symbol L2 is assigned to the VSS wiring. The ALL-ON wiring L1 and the VSS wiring L2 are in a state of being electrically separated from each other. That is to say, the ALL-ON wiring L1 and the VSS wiring L2 are formed as power supply wirings independent of each other. Moreover, while a low-potential power supply input terminal is provided in each circuit in the liquid crystal panel 5, only the low-potential power supply input terminal of the gate driver 200 is connected to the ALL-ON wiring L1, and the low-potential power supply input terminals of the circuits other than the gate driver 200 are connected to the VSS wiring L2.

The protection circuit 400 protects the circuits in the liquid crystal panel 5 from the static electricity. The control circuits 501 and 502 perform, for example, conversion of a level of a power supply potential so that desired operations are performed in the gate driver 200 and the source driver 300. Based on the control signals outputted from the panel control circuit 600, the gate driver 200 repeats application of the active scanning signals to the respective gate bus lines GL1 to GLi while taking one vertical scanning period as a cycle. Based on the digital video signals and the control signals, which are outputted from the panel control circuit 600, the source driver 300 applies driving video signals to the respective source bus lines SL1 to SLj.

In the way as described above, the driving video signals are applied to the respective source bus lines SL1 to SLj, and the scanning signals are applied to the respective gate bus lines GL1 to GLi, whereby an image, which is based on the image signal DAT sent from the outside, is displayed on the display unit 100. Note that, in the present embodiment, a first first-potential power supply wiring is realized by the ALL-ON wiring L1, and a second first-potential power supply wiring is realized by the VSS wiring L2. Moreover, the low-potential power supply corresponds to a first-potential power supply, and the high-potential power supply corresponds to a second-potential power supply.

1.2 Configuration and Operation of Gate Driver

Figure 3:
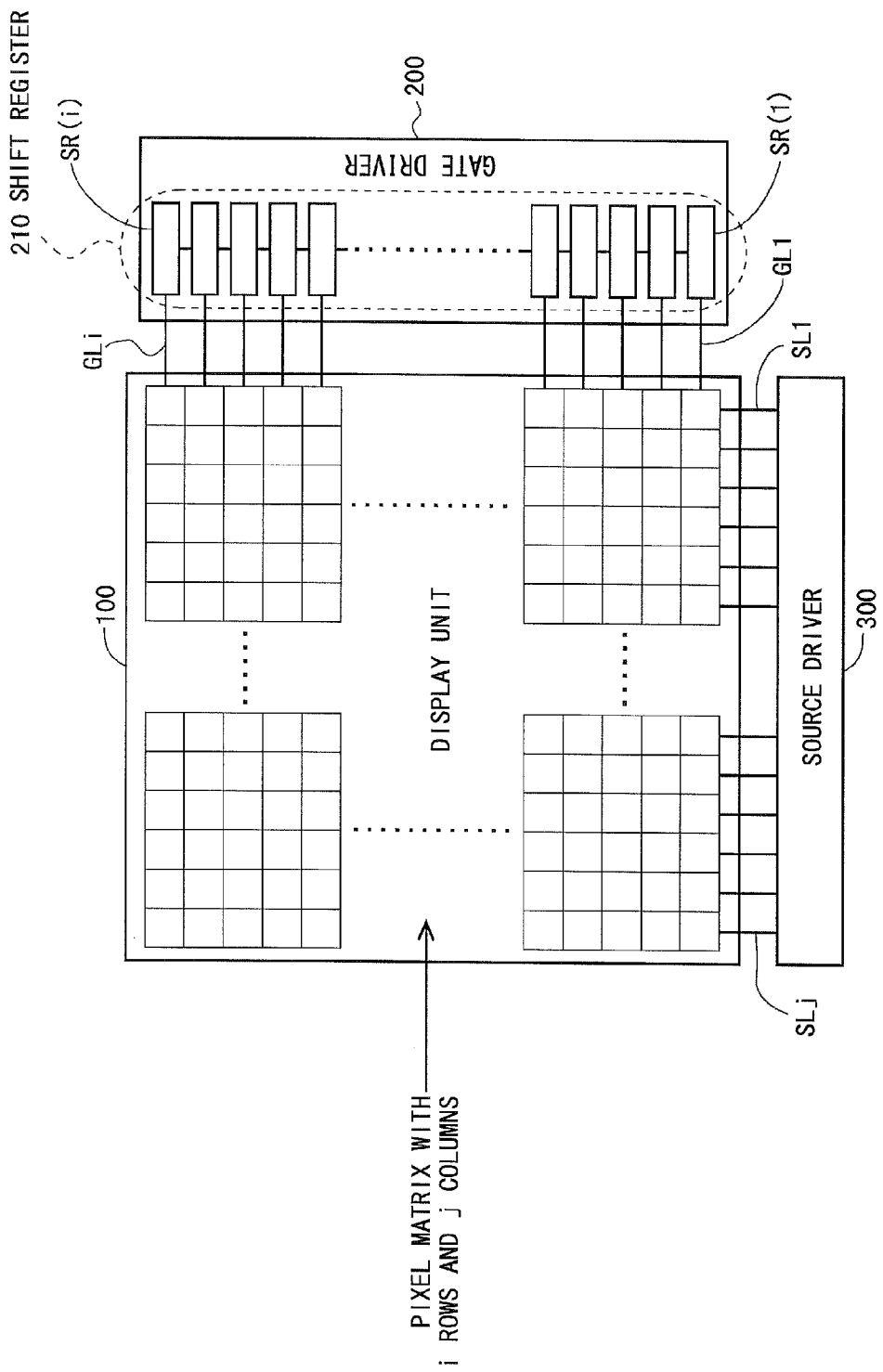
FIG. 3 is a block diagram for explaining a configuration of a gate driver in the first embodiment.
Figure 4:
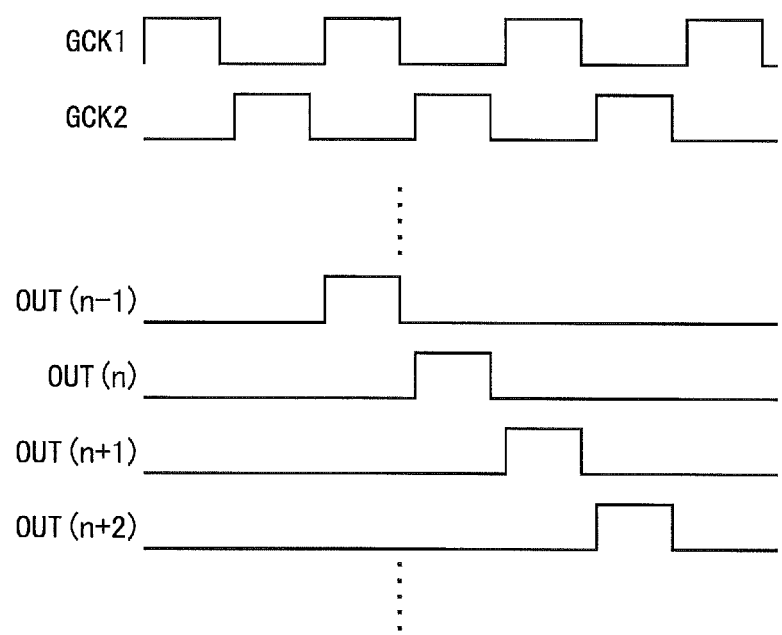
FIG. 4 is a signal waveform chart for explaining an operation of the gate driver in the first embodiment.
Figure 16:
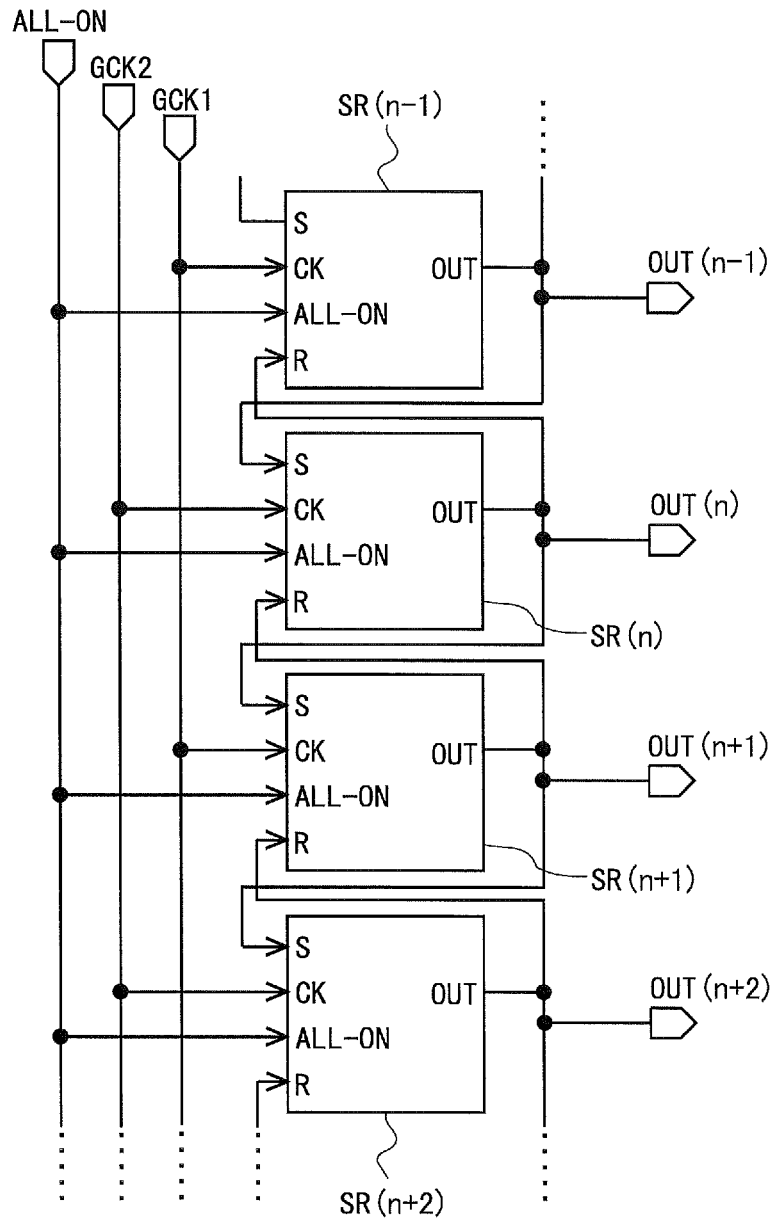
FIG. 16 is a schematic configuration view of a gate driver.
Figure 17:
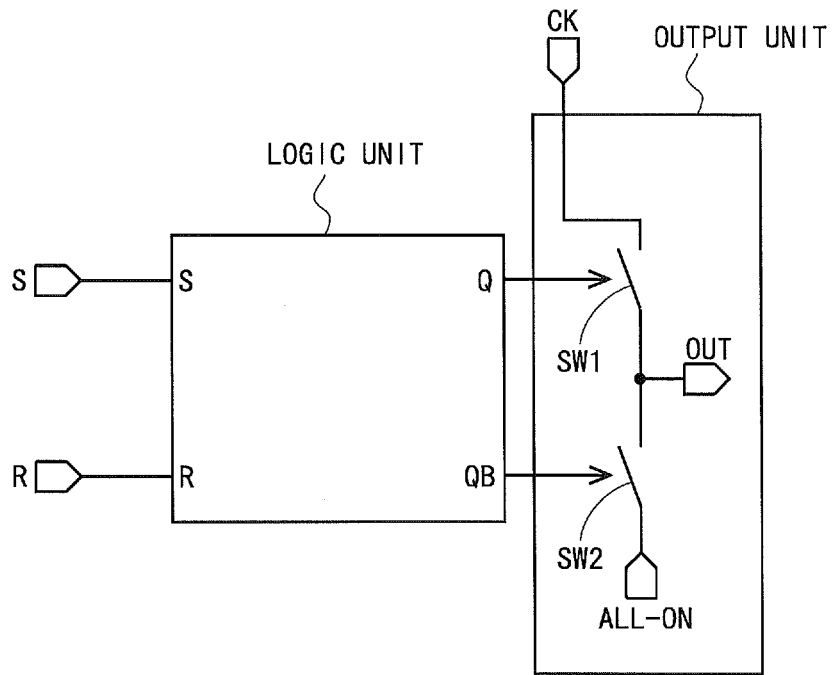
FIG. 17 is a schematic configuration view of a stage constituent circuit in a conventional example.
Figure 18:
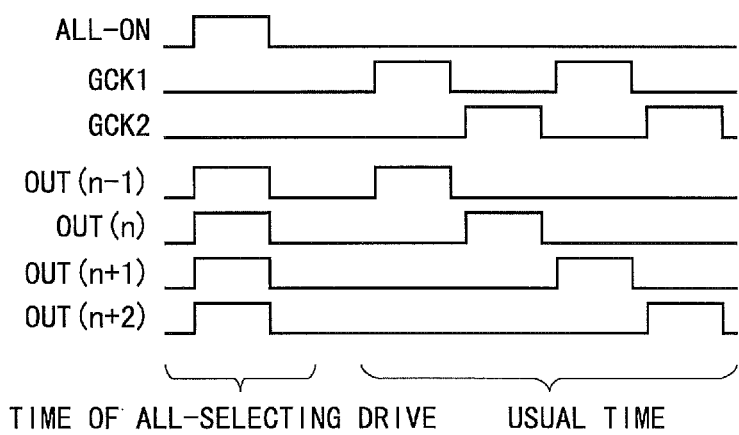
FIG. 18 is a signal waveform chart for explaining an operation of a gate driver in the conventional example.
Figure 19:
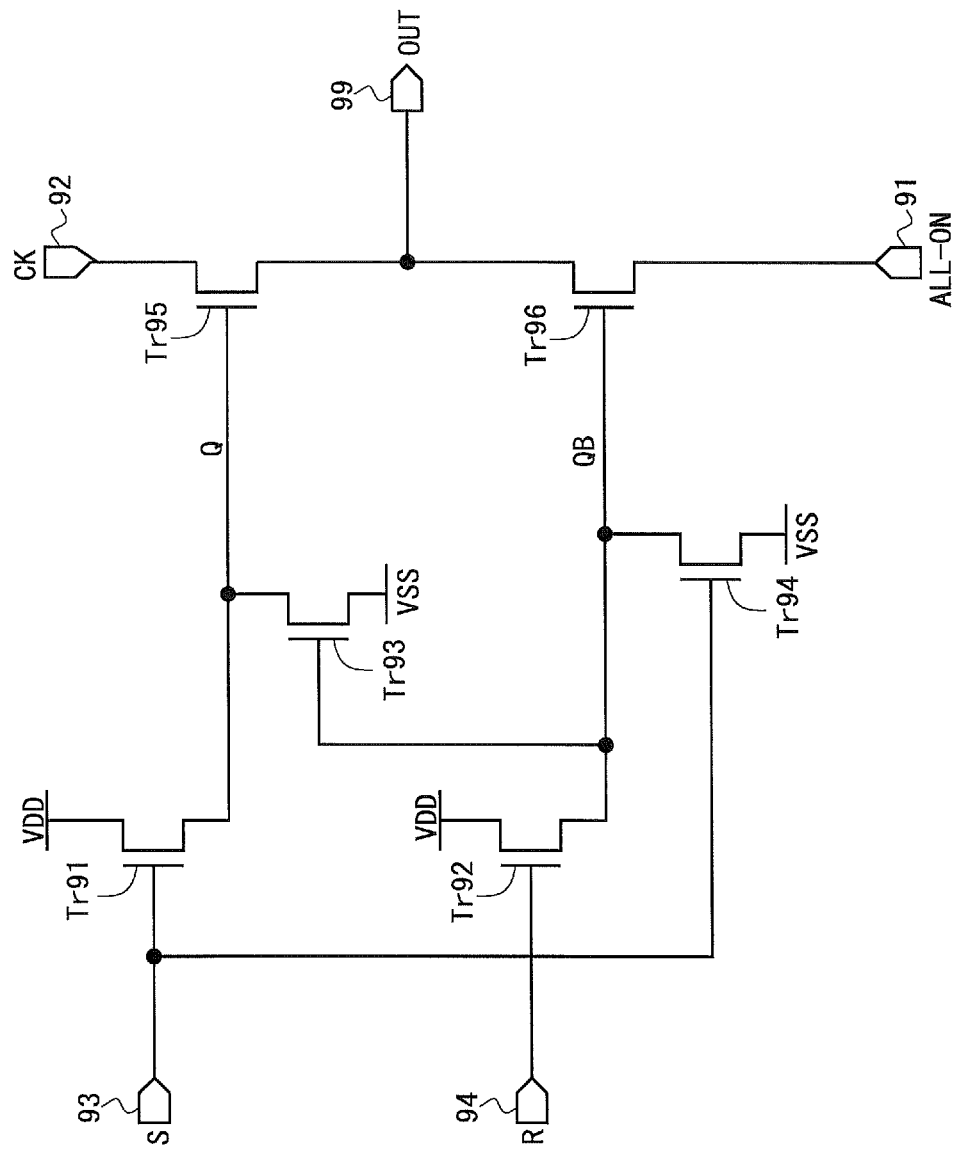
FIG. 19 is a view showing a configuration example of a conventional stage constituent circuit.
Figure 20:
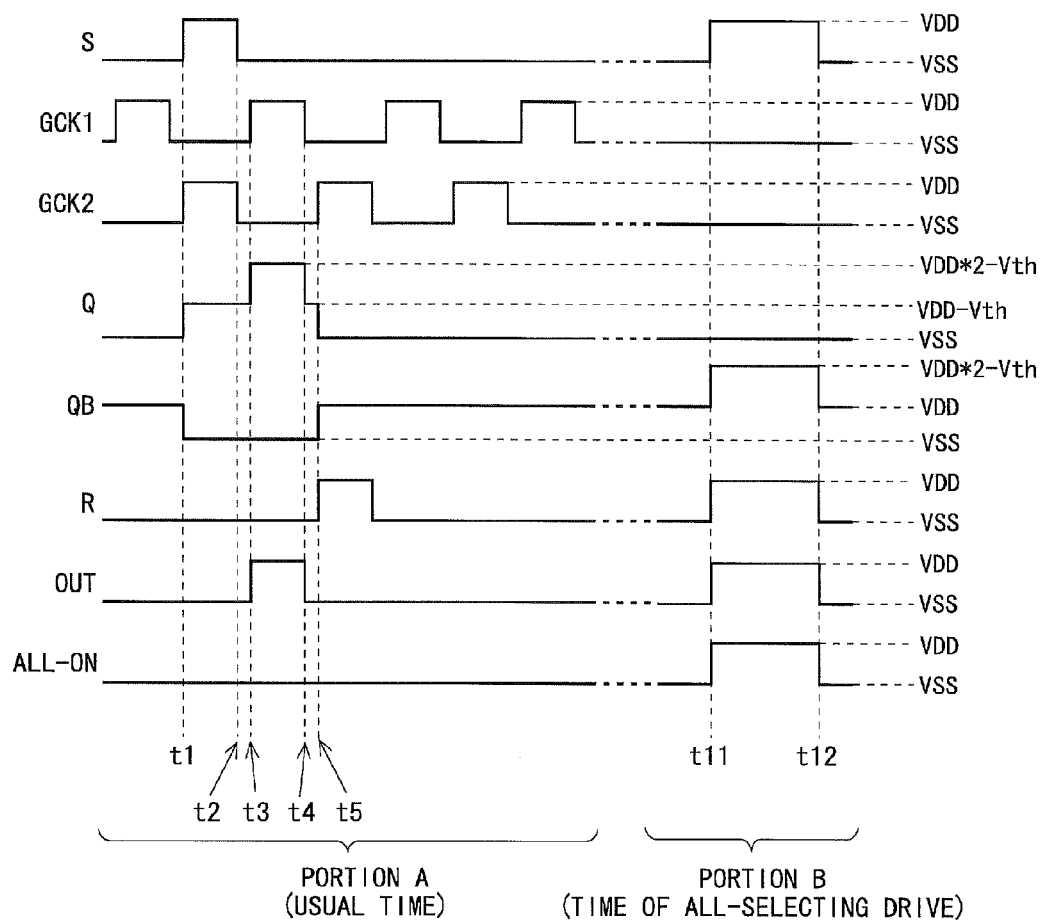
FIG. 20 is a signal waveform chart for explaining an operation of the stage constituent circuit in the conventional example.
Figure 21:
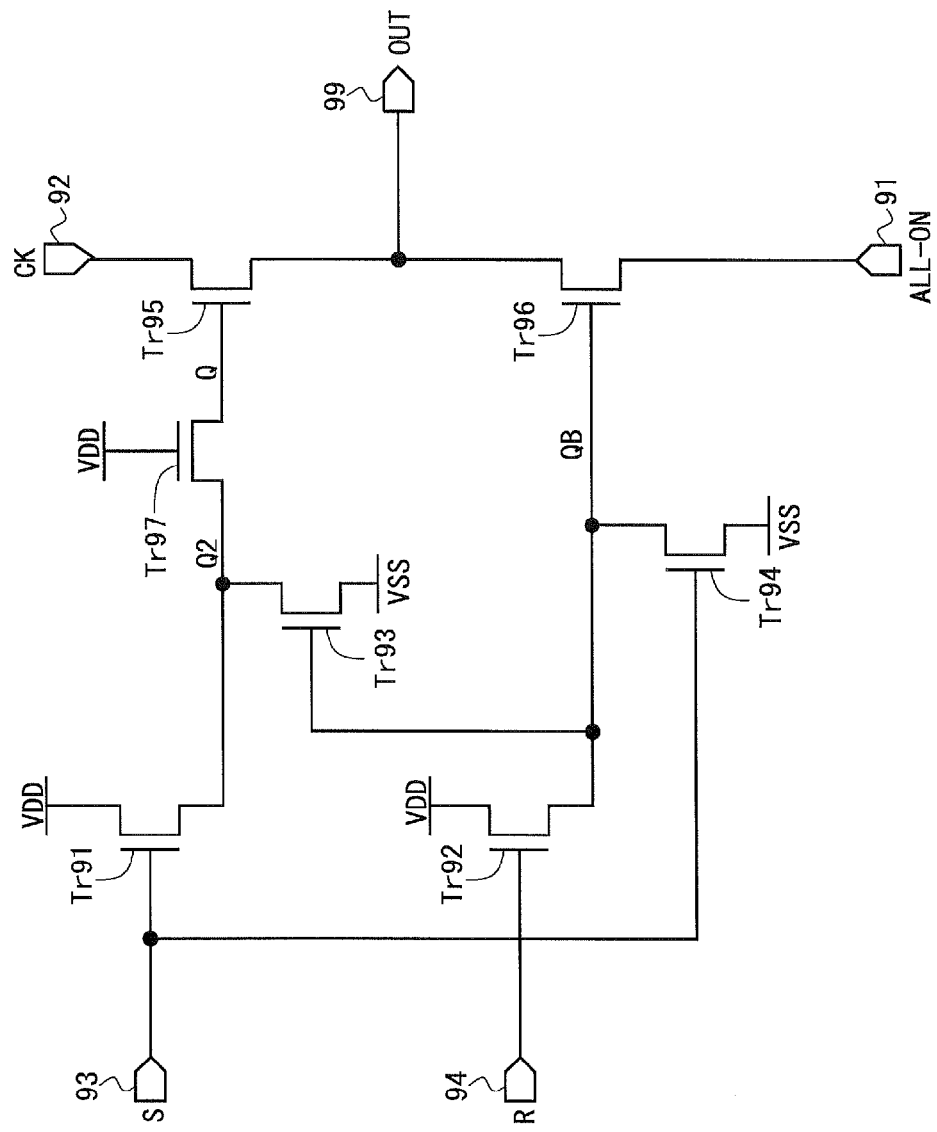
FIG. 21 is a view showing a configuration example of the conventional stage constituent circuit.

Next, while referring to FIG. 3, FIG. 4 and FIG. 16, a description is made of outlines of a configuration and operation of the gate driver 200 in the present embodiment. As shown in FIG. 3, the gate driver 200 is constituted by a shift register 210 made of a plurality of stages. On the display unit 100, a pixel matrix with i rows and j columns is formed. The respective stages of the shift register 210 are provided so as to correspond to these respective rows of the pixel matrix in a one-to-one relationship. That is to say, the shift register 210 includes i pieces of the stage constituent circuits SR(1) to SR(i). The i pieces of these stage constituent circuits SR(1) to SR(i) are connected in series to one another.

A schematic configuration of the gate driver 200 is a configuration similar to a conventional one as shown in FIG. 16. In each of the stage constituent circuits, there are provided: an input terminal for receiving the set signal S; an input terminal for receiving the clock signal CK; an input terminal for receiving the all-selecting signal ALL-ON; an input terminal for receiving the reset signal R; and an output terminal for outputting the scanning signal OUT. Each of the stage constituent circuits is given the scanning signal OUT, which is outputted from the stage constituent circuit on the preceding stage, as the set signal S, and is given the scanning signal OUT, which is outputted from the stage constituent circuit on the next stage, as the reset signal R. All of the stage constituent circuits are commonly given the all-selecting signal ALL-ON. Moreover, the stage constituent circuits are given the first gate clock signal GCK1 and the second gate clock signal GCK2 as the clock signal CK alternately every other stage. Note that the stage constituent circuit on the first stage is given the gate start pulse signal (start instruction signal) as the set signal S.

In the configuration as described above, when the first stage of the shift register 210 is given a pulse of the gate start pulse signal as the set signal S, the pulse included in the gate start pulse signal is sequentially transferred from the first stage to the i-th stage based on the first gate clock signal GCK1 and the second gate clock signal GCK2, in each of which an ON duty is set at a value of approximately 50%. Then, in accordance with this transfer of the pulse, the scanning signals OUT outputted from the respective stages sequentially turn to the high level. In this way, as shown in FIG. 4, the scanning signals OUT1 to OUTi, which sequentially turn to the high level every predetermined period, are given to the gate bus lines GL1 to GLi in the display unit 100.

1.3 Configuration of Stage Constituent Circuit

Figure 1:
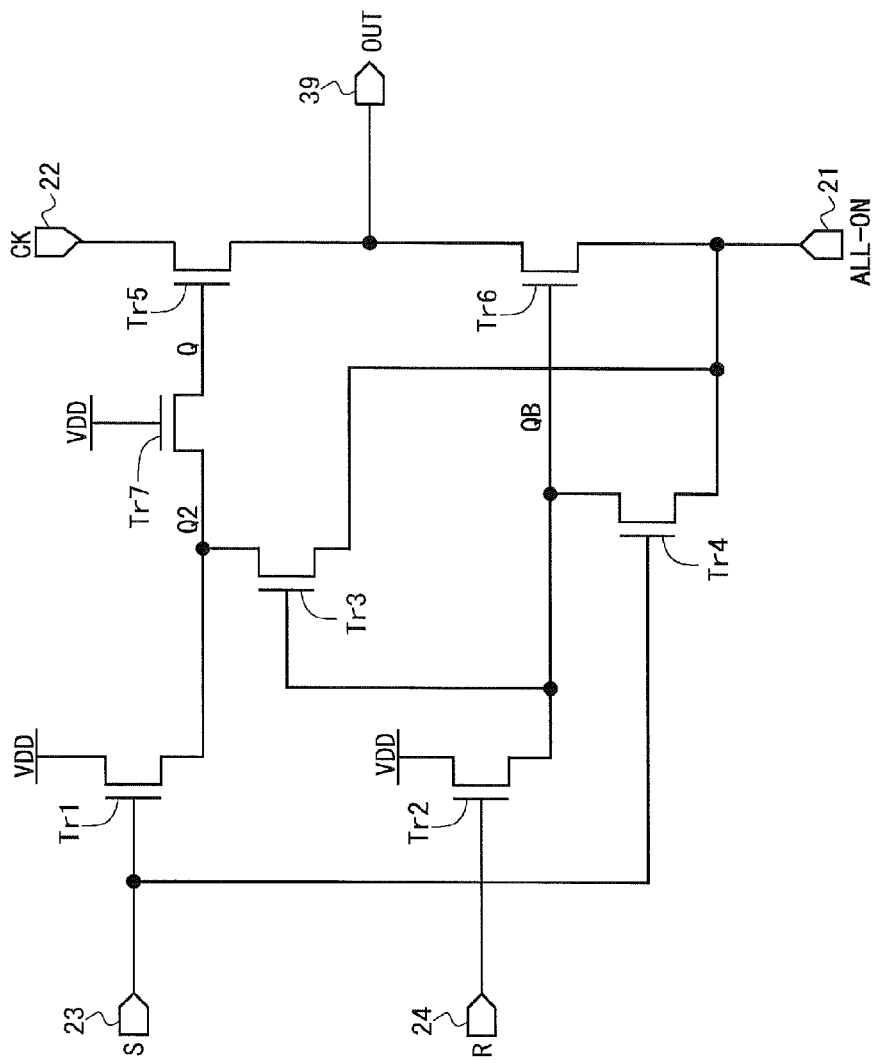
FIG. 1 is a circuit diagram showing a configuration of a stage constituent circuit (a configuration of one stage of a shift register) in an active matrix-type liquid crystal display device according to a first embodiment of the present invention.

FIG. 1 is a circuit diagram showing a configuration of the stage constituent circuit (a configuration of one stage of the shift register 210) in the present embodiment. As shown in FIG. 1, this stage constituent circuit includes seven thin film transistors Tr1 to Tr7. Moreover, this stage constituent circuit includes four input terminals 21 to 24 and one output terminal 39 as well as an input terminal for a high-potential power supply. Here, reference numeral 21 is assigned to an input terminal that receives the all-selecting signal ALL-ON, reference numeral 22 is assigned to an input terminal that receives the clock signal CK, reference numeral 23 is assigned to an input terminal that receives the set signal S, and reference numeral 24 is assigned to an input terminal that receives the reset signal R.

Next, a description is made of a connection relationship among constituent elements in this stage constituent circuit. A source terminal of the thin film transistor Tr2, a gate terminal of the thin film transistor Tr3, a drain terminal of the thin film transistor Tr4 and a gate terminal of the thin film transistor Tr6 are connected to one another. Note that a region (wiring) where these are connected to one another is referred to as a "QB node" for convenience. A gate terminal of the thin film transistor Tr5 and a source terminal of the thin film transistor Tr7 are connected to each other. Note that a region (wiring) where these are connected each other is referred to as a "Q node" for convenience. A source terminal of the thin film transistor Tr1, a drain terminal of the thin film transistor Tr3 and a drain terminal of the thin film transistor Tr7 are connected to one another. Note that a region (wiring) where these are connected to one another is referred to as a "Q2 node" for convenience.

With regard to the thin film transistor Tr1, a gate terminal thereof is connected to the input terminal 23, a drain terminal thereof is connected to an input terminal for the high-potential power supply, and the source terminal thereof is connected to the Q2 node. With regard to the thin film transistor Tr2, a gate terminal thereof is connected to the input terminal 24, a drain terminal thereof is connected to the input terminal for the high-potential power supply, and the source terminal thereof is connected to the QB node. With regard to the thin film transistor Tr3, the gate terminal thereof is connected to the QB node, the drain terminal thereof is connected to the Q2 node, and a source terminal thereof is connected to the input terminal 21. With regard to the thin film transistor Tr4, a gate terminal thereof is connected to the input terminal 23, the drain terminal thereof is connected to the QB node, and a source terminal thereof is connected to the input terminal 21. With regard to the thin film transistor Tr5, the gate terminal thereof is connected to the Q node, a drain terminal thereof is connected to the input terminal 22, and a source terminal thereof is connected to the output terminal 39. With regard to the thin film transistor Tr6, the gate terminal thereof is connected to the QB node, a drain terminal thereof is connected to the output terminal 39, and a source terminal thereof is connected to the input terminal 21. With regard to the thin film transistor Tr7, a gate terminal is connected to the input terminal for the high-potential power supply, the drain terminal thereof is connected to the Q2 node, and the source terminal thereof is connected to the Q node.

Next, a description is made of functions of the respective constituent elements at the usual time. The thin film transistor Tr1 changes a potential of the Q2 node toward the high level when the set signal S is at the high level. The thin film transistor Tr2 changes a potential of the QB node toward the high level when the reset signal R is at the high level. The thin film transistor Tr3 changes the potential of the Q2 node toward the low level when the potential of the QB node is at the high level. The thin film transistor Tr4 changes the potential of the QB node toward the low level when the set signal S is at the high level. The thin film transistor Tr5 gives a potential of the clock signal CK to the output terminal 39 when a potential of the Q node is at the high level. The thin film transistor Tr6 changes the potential of the output terminal 39 toward the low level when the potential of the QB node is at the high level. The thin film transistor Tr7 functions as voltage dividing means so that a voltage equal to or more than a withstand voltage cannot be applied between the drain and source of the thin film transistor Tr3 even when the potential of the Q node becomes significantly high.

Note that, in the present embodiment, a second control node turn-on portion is realized by the thin film transistor Tr1, a first control node turn-on portion is realized by the thin film transistor Tr2, a second control node turn-off switching element is realized by the thin film transistor Tr3, and a first control node turn-off switching element is realized by the thin film transistor Tr4. Moreover, an output node turn-on switching element is realized by the thin film transistor Tr5, and an output node turn-off switching element is realized by the thin film transistor Tr6. Furthermore, a voltage-dividing switching element is realized by the thin film transistor Tr7. Still further, an output node is realized by the output terminal 39, a first control node is realized by the QB node, and a second control node is realized by the Q node.

1.4 Operation of Stage Constituent Circuit at Usual Time

Figure 5:
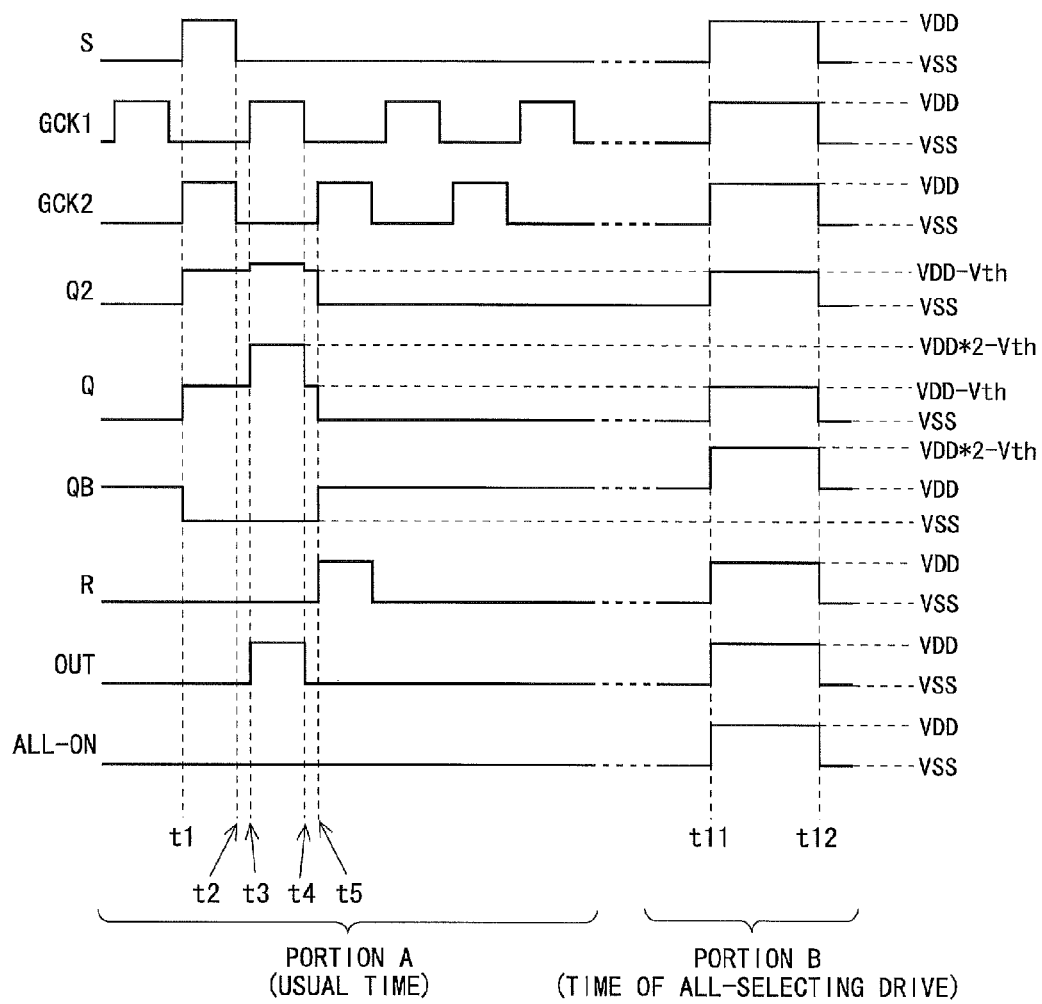
FIG. 5 is a signal waveform chart for explaining an operation of the stage constituent circuit in the first embodiment.

Next, while referring to FIG. 1 and a portion A of FIG. 5, a description is made of an operation of the stage constituent circuit at the usual time. Note that a period from a point of time t3 to a point of time t4 is assumed to be a period in which the gate bus line connected to this stage constituent circuit should be selected. Moreover, the input terminal 22 of this stage constituent circuit is assumed to be given the first gate clock signal GCK1. The all-selecting signal ALL-ON is maintained at the low level during the usual time.

In a period before a point of time t1, the potential of the Q node and the potential of the Q2 node are maintained at the low level, and the potential of the QB node is maintained at the high level. When the point of time t1 comes, and the set signal S is changed from the low level to the high level, the thin film transistors Tr1 and Tr4 turn to the ON state. By the fact that the thin film transistor Tr1 turns to the ON state, the potential of the Q2 node is changed from the low level to the high level. At this time, the thin film transistor Tr7 is in the ON state, and the potential of the Q node is also changed from the low level to the high level. Moreover, by the fact that the thin film transistor Tr4 turns to the ON state, the potential of the QB node is changed from the high level to the low level.

When the point of time t3 comes after the set signal S is changed from the high level to the low level at a point of time t2, the first gate clock signal GCK1 is changed from the low level to the high level. At this time, the thin film transistor Tr5 is in the ON state, and accordingly, a potential of the output terminal 39 (a potential of the scanning signal OUT) rises together with a rise of a potential of the input terminal 22. Parasitic capacitances are present between a gate and source of the thin film transistor Tr5 and between the gate and drain thereof, and accordingly, the potential of the Q node also rises (Q node is boot-strapped) together with the rise of the potential of the output terminal 39. As a result, the potential of the Q node becomes "(VDD×2)−Vth". In this way, a large voltage is applied to the gate terminal of the thin film transistor Tr5, and the potential of the output terminal 39 rises to a high-level potential of the first gate clock signal GCK1 without causing the so-called threshold voltage drop. As described above, the gate bus line connected to the output terminal 39 of this stage constituent circuit turns to the selected state.

Note that, during a period from a point of time t3 to a point of time t4, the thin film transistor Tr2 is maintained in the OFF state since the reset signal R is at the low level. Therefore, during this period, the QB node is maintained in the low level, and the thin film transistors Tr3 and Tr6 are maintained in the OFF state. Hence, during this period, the potentials of the Q2 node, the Q node and the output terminal 39 are not lowered. Moreover, in the present embodiment, the thin film transistor Tr7 is provided between the gate terminal of the thin film transistor Tr5 and the drain terminal of the thin film transistor Tr3. Therefore, even when the potential of the Q node is higher than VDD by the boot strap during the period from the point of time t3 to the point of time t4, the thin film transistor Tr7 functions as the voltage driving means, and accordingly, the voltage exceeding the withstand voltage is not applied to the thin film transistor Tr3.

When the point of time t4 comes, the first gate clock signal GCK1 is changed from the high level to the low level. In this way, the potential of the output terminal 39 is lowered together with the lowering of the potential of the input terminal 22. Therefore, the potential of the Q node is also lowered through the parasitic capacitance of the thin film transistor Tr5. Following this, the potential of the Q2 node is also lowered. When a point of time t5 comes, the reset signal R is changed from the low level to the high level. In this way, the thin film transistor Tr2 turns to the ON state. As a result, the potential of the QB node is changed from the low level to the high level. In this way, the thin film transistor Tr3 turns to the ON state, and accordingly, the potential of the Q2 node and the potential of the Q node are further lowered. Moreover, the thin film transistor Tr6 turns to the ON state, and accordingly, the potential of the output terminal 39 is drawn into the low level.

Such an operation as described above is performed in the respective stage constituent circuits in the shift register 210, whereby, as mentioned above, the scanning signals OUT1 to OUTi, which sequentially turn to the high level every predetermined period, are given to the gate bus lines GL1 to GLi in the display unit 100.

1.5 Operation of Stage Constituent Circuit at Time of All-Selecting Drive

Next, while referring to FIG. 1 and a portion B of FIG. 5, a description is made of an operation of the stage constituent circuit at the time of the all-selecting drive. Note that a period from a point of time t11 to a point of time t12 is assumed to be a period in which all of the gate bus lines should be set in the selected state. In a period before the point of time t11, the potential of the Q node is at the low level, and the potential of the QB node is at the high level. When the point of time t11 comes, the all-selecting signal ALL-ON is changed from the low level to the high level. At this time, the potential of the QB node rises from VDD to "VDD×2−Vth" by a boot strap caused by a parasitic capacitance of the thin film transistor Tr6. In this way, a large voltage is applied to the gate terminal of the thin film transistor Tr6, and the potential of the output terminal 39 (the potential of the scanning signal OUT) rises to the potential of the all-selecting signal ALL-ON without causing the so-called threshold voltage drop. Such an operation as described above is performed in all of the stage constituent circuits, and all of the gate bus lines turn to the selected state in the period from the point of time t11 to the point of time t12. Here, in the present embodiment, the source terminal of the thin film transistor Tr3 and the source terminal of the thin film transistor Tr4 are connected to the input terminal 21 that receives the all-selecting signal ALL-ON. Therefore, even when the potential of the QB node rises to "VDD×2−Vth", the voltage exceeding the withstand voltage is not applied to the thin film transistor Tr3 and the thin film transistor Tr4.

Incidentally, each of the stage constituent circuits is given the scanning signal OUT, which is outputted from the stage constituent circuit on the preceding stage, as the set signal S, and accordingly, during the period in which the all-selecting drive is performed, the thin film transistor Tr1 turns to the ON state, and the potential of the Q2 node and the potential of the Q node turn to the high level. In this way, the thin film transistor Try turns to the ON state. Moreover, as mentioned above, the thin film transistor Tr6 is also in the ON state. Therefore, during the period from the point of time t11 to the point of time t12, the first gate clock signal GCK1 and the second gate clock signal GCK2 are set at the high level. This is because, if the first gate clock signal GCK1 and the second gate clock signal GCK2 are set at the low level, an overcurrent flows between the input terminal 21 and the input terminal 22.

Moreover, during the period from the point of time t11 to the point of time t12, in each of the stage constituent circuits, the set signal S (the gate start pulse signal or the scanning signal OUT outputted from the stage constituent circuit on the preceding stage) turns to the high level, and the reset signal R (the scanning signal OUT outputted from the stage constituent circuit on the next stage) turns to the high level, and accordingly, the Q2 node, the Q node and the QB node are supplied with the high-potential power supply VDD though the so-called threshold voltage drop occurs therein. Hence, in each of the stage constituent circuits, a floating node (a node in an electrically floating state) is not present. Therefore, the state where all of the gate bus lines are selected is maintained for a long period.

1.6 Effects

Figure 22:
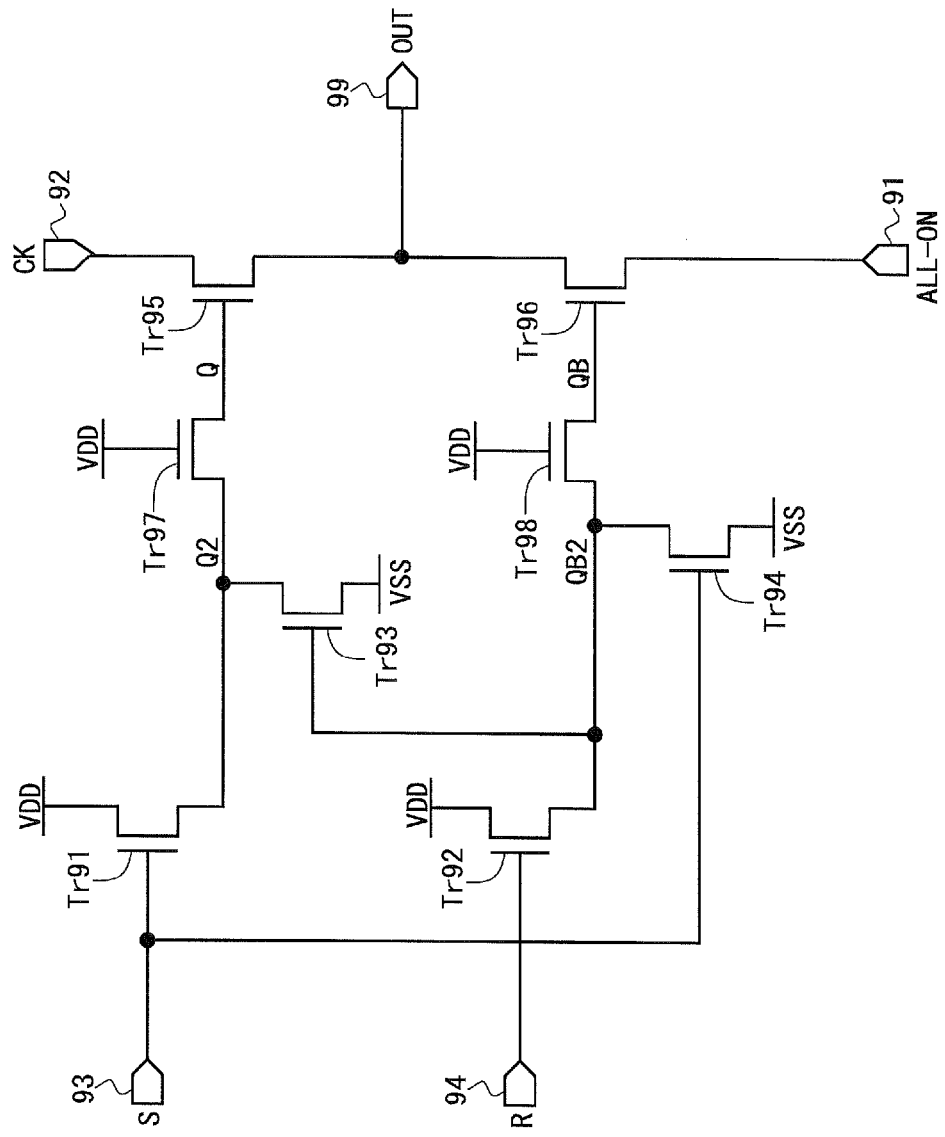
FIG. 22 is a view showing a configuration example of the conventional stage constituent circuit.

According to the present embodiment, in the liquid crystal display device including the gate driver 200 capable of the all-selecting drive for the gate bus lines, the source terminals of a part of the thin film transistors included in the stage constituent circuit that constitutes the shift register 210 in the gate driver 200 are connected to the input terminal 21 for the all-selecting signal ALL-ON. Specifically, as shown in FIG. 1, the source terminal of the thin film transistor Tr3, in which the gate terminal is connected to the QB node (the node connected to the gate terminal of the thin film transistor Tr6 for setting the potential of the output terminal 39 at the low level), and the source terminal of the thin film transistor Tr4, in which the drain terminal is connected to the QB node, are connected to the input terminal 21 for the all-selecting signal ALL-ON. Therefore, even when the potential of the QB node rises significantly owing to the fact that the all-selecting signal ALL-ON is changed from the low level to the high level, the voltage exceeding the withstand voltage is not applied to the thin film transistor Tr3 and the thin film transistor Tr4. Incidentally, in the conventional technology, in order to prevent the voltage, which exceeds the withstand voltage, from being applied to the thin film transistors when the potential of the QB node rises significantly, the thin film transistor (the thin film transistor Tr98 of FIG. 22), which functions as the voltage dividing means, has been provided in the stage constituent circuit. As opposed to this, in the present embodiment, a thin film transistor, which corresponds to the thin film transistor Tr98 of FIG. 22, is not provided in the stage constituent circuit. From the above, it becomes possible to perform the all-selecting drive for the gate bus lines without increasing the number of circuit elements more than heretofore and without lowering the withstand voltage reliability.

Moreover, in the present embodiment, the ALL-ON wiring L1 for supplying the all-selecting signal ALL-ON and the VSS wiring L2 for supplying the low-potential power supply VSS are in the state of being electrically separated from each other. Then, only the low-potential power supply input terminal of the gate driver 200 is connected to the ALL-ON wiring L1, and the low-potential power supply input terminals of the circuits other than the gate driver 200 are connected to the VSS wiring L2. Therefore, even when the all-selecting signal ALL-ON is changed from the low level to the high level at the time of the all-selecting drive, an abnormal operation (for example, an abnormal operation owing to malfunctions of the control circuits 501 and 502 or flow of an overcurrent through the protection circuit 400) is not caused.

1.7 Modification Example

Figure 6:
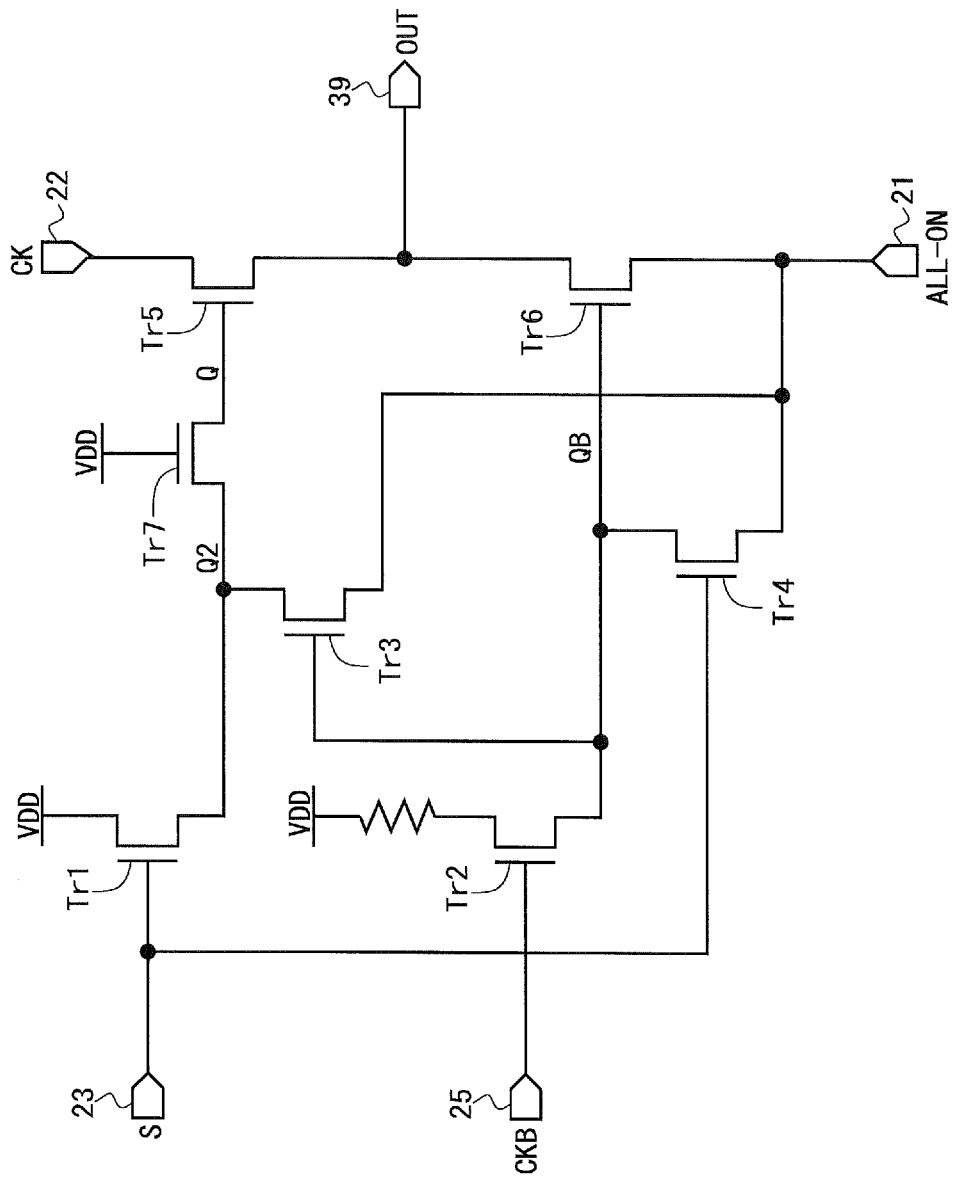
FIG. 6 is a circuit diagram showing a configuration of a stage constituent circuit in a modification example of the first embodiment.

In the above-described first embodiment, a configuration, in which the QB node is charged based on the reset signal R, is adopted; however, the present invention is not limited to this. For example, the QB node may be charged based on a clock signal CKB different from the clock signal given to the input terminal 22 out of such two-phase clock signals (first gate clock signal GCK1 and second gate clock signal GCK2). In this modification example, as shown in FIG. 6, the gate terminal of the thin film transistor Tr2 is connected to the input terminal 25 for receiving the clock signal CKB, and the drain terminal of the thin film transistor Tr2 is connected to the input terminal for the high-potential power supply through a resistor. According to this modification example, at the time of the all-selecting drive, the clock signal CKB turns to the high level. Accordingly, though the so-called threshold voltage drop occurs in the QB node, the high-potential power supply VDD is supplied thereto. In this way, also in this modification example, at the time of performing the all-selecting drive, it becomes possible to maintain the state, where all of the gate bus lines are selected, for a long period.

2. Second Embodiment

2.1 Configuration

A description is made of a second embodiment of the present invention. Note that the description is made of only different points from those of the above-described first embodiment, and a description of similar points to those of the above-described first embodiment is omitted. In the present embodiment, switching of the scanning order of the gate bus lines can be performed. Such switching of the scanning order stands for that the switching is performed between forward order scanning for turning the gate bus lines to the selected state one by one from one end (for example, an upper end) of the display unit 100 to other end (for example, a lower end) thereof and reverse order scanning for turning the gate bus lines to the selected state one by one from the other end of the display unit 100 to one end thereof.

Figure 7:
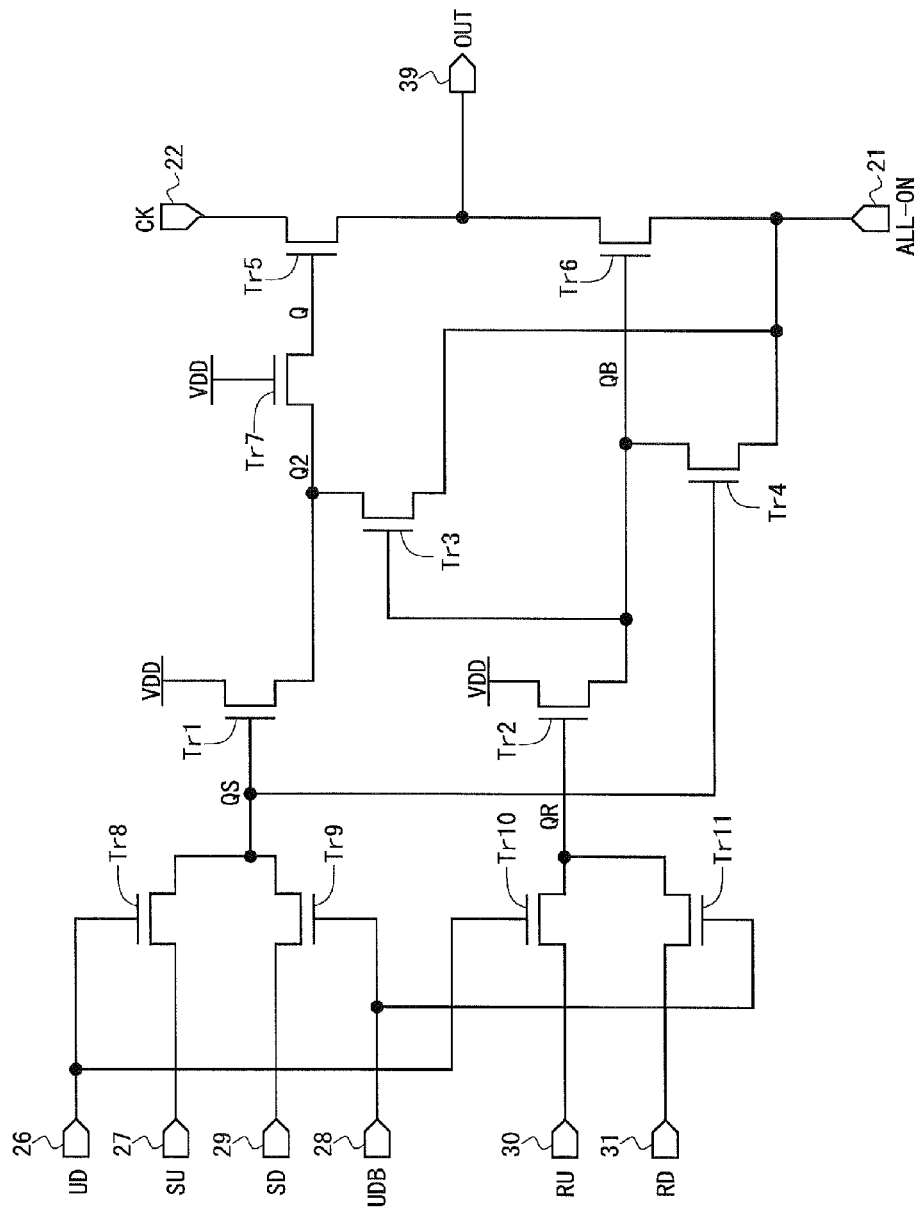
FIG. 7 is a circuit diagram showing a configuration of a stage constituent circuit in a second embodiment of the present invention.

FIG. 7 is a circuit diagram showing a configuration of the stage constituent circuit in the present embodiment. As shown in FIG. 7, this stage constituent circuit includes four thin film transistors Tr8 to Tr11 and six input terminals 26 to 31 in addition to the constituent elements in the above-described first embodiment. To the input terminal 26, a forward order instruction signal UD, which turns to the high-level at the time of the forward order scanning, is inputted. To the input terminal 27, a set signal SU for the forward order scanning is inputted. To the input terminal 28, a reverse order instruction signal UDB, which turns to the high level at the time of the reverse order scanning, is inputted. To the input terminal 29, a set signal SD for the reverse order scanning is inputted. To the input terminal 30, a reset signal RU for the forward order scanning is inputted. To the input terminal 31, a reset signal RD for the reverse order scanning is inputted. Note that a region (wiring) where the gate terminal of the thin film transistor Tr1, the gate terminal of the thin film transistor Tr4, a source terminal of the thin film transistor Tr8 and a source terminal of the thin film transistor Tr9 are connected to one another is referred to as a "QS node" for convenience. Moreover, a region (wiring) where the gate terminal of the thin film transistor Tr2, a source terminal of the thin film transistor Tr10 and a source terminal of the thin film transistor Tr11 are connected to one another is referred to as a "QR node" for convenience.

Note that a second switch-control switching element is realized by the thin film transistors Tr8 and Tr9, and a first switch-control switching element is realized by the thin film transistors Tr10 and Tr11. Moreover, a switching control signal is realized by the forward order instruction signal UD and the reverse order instruction signal UDB.

Next, a description is made of a connection relationship among constituent elements in this stage constituent circuit. The thin film transistors Tr3 to Tr7 are similar to those of the above-described first embodiment. With regard to the thin film transistor Tr1, the gate terminal thereof is connected to the QS node, the drain terminal thereof is connected to the input terminal for the high-potential power supply, and the source terminal thereof is connected to the Q2 node. With regard to the thin film transistor Tr2, the gate terminal thereof is connected to the QR node, the drain terminal thereof is connected to the input terminal for the high-potential power supply, and the source terminal thereof is connected to the QB node. With regard to the thin film transistor Tr8, a gate terminal thereof is connected to the input terminal 26, a drain terminal thereof is connected to the input terminal 27, and the source terminal thereof is connected to the QS node. With regard to the thin film transistor Tr9, a gate terminal thereof is connected to the input terminal 28, a drain terminal thereof is connected to the input terminal 29, and the source terminal thereof is connected to the QS node. With regard to the thin film transistor Tr10, a gate terminal thereof is connected to the input terminal 26, a drain terminal thereof is connected to the input terminal 30, and the source terminal thereof is connected to the QR node. With regard to the thin film transistor Tr11, a gate terminal thereof is connected to the input terminal 28, a drain terminal thereof is connected to the input terminal 31, and the source terminal thereof is connected to the QR node.

In the present embodiment, in each of the stage constituent circuits, the scanning signal OUT, which is outputted from the stage constituent circuit on the preceding stage, is given as the set signal SU for the forward order scanning to the input terminal 27, and in addition, is given as the reset signal RD for the reverse order scanning to the input terminal 31. Moreover, in each of the stage constituent circuits, the scanning signal OUT outputted from the stage constituent circuit on the next stage is given as the set signal SD for the reverse order scanning to the input terminal 29, and in addition, is given as the reset signal RU for the forward order scanning to the input terminal 30.

2.2 Operation of Stage Constituent Circuit

At the usual time, when the forward order scanning is performed, the forward order instruction signal UD is set at the high level, and the reverse order instruction signal UDB is set at the low level. At this time, the thin film transistors Tr8 and Tr10 turn to the ON state, and the thin film transistors Tr9 and Tr11 turn to the OFF state. In this way, the stage constituent circuit operates based on the set signal SU for the forward order scanning and the reset signal RU for the forward order scanning. At the usual time, when the reverse order scanning is performed, the forward order instruction signal UD is set at the low level, and the reverse order instruction signal UDB is set at the high level. At this time, the thin film transistors Tr8 and Tr10 turn to the OFF state, and the thin film transistors Tr9 and Tr11 turn to the ON state. In this way, the stage constituent circuit operates based on the set signal SD for the reverse order scanning and the reset signal RD for the reverse order scanning. In this way, the signal given to the QS node functions as the set signal S in the above-described first embodiment, and the signal given to the QR node functions as the reset signal R in the above-described first embodiment, whereby a similar operation to that of the above-described first embodiment is performed in the stage constituent circuit.

At the time of the all-selecting drive, in a similar way to the above-described first embodiment, the all-selecting signal ALL-ON is changed from the low level to the high level. At this time, a potential of the QS node becomes higher than VDD by a boot strap caused by a parasitic capacitance of the thin film transistor Tr4. In a similar way, a potential of the QR node becomes higher than VDD by a boot strap caused by a parasitic capacitance of the thin film transistor Tr2. Here, for example, since the reverse order instruction signal UDB is at the low level in a case where the forward order scanning is performed, it is apprehended that the voltage, which exceeds the withstand voltage, may be applied between the gates and sources of the thin film transistors Tr9 and Tr11. Accordingly, in the present embodiment, during the period in which the all-selecting signal ALL-ON is maintained at the high level, the forward order instruction signal UD and the reverse order instruction signal UDB are set at the high level.

Figure 8:
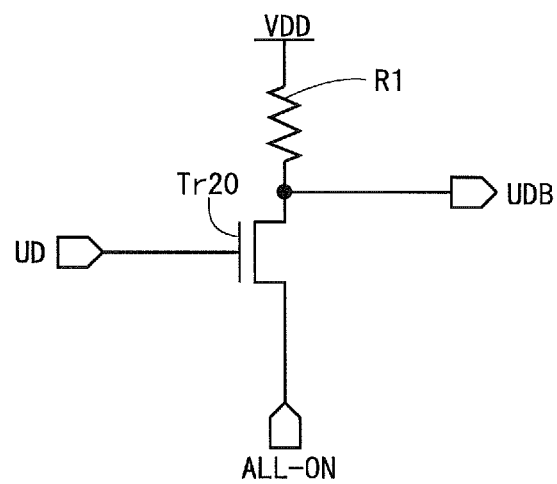
FIG. 8 is a circuit diagram showing a configuration of a circuit for generating a reverse order instruction signal in the second embodiment.

Incidentally, a circuit with a configuration shown in FIG. 8 is provided in the inside of the gate driver 200, whereby it becomes possible to generate the reverse order instruction signal UDB relatively easily based on the forward order instruction signal UD in the inside of the gate driver 200. In the configuration shown in FIG. 8, at the time when the all-selecting signal ALL-ON is at the low level, that is, at the usual time, if the positive order instruction signal UD is at the high level, then a thin film transistor Tr20 turns to the ON state, and accordingly, the reverse order instruction signal UDB turns to the low level. Moreover, if the forward order instruction signal UD is at the low level, then the thin film transistor Tr20 turns to the OFF state, and accordingly, the reverse order instruction signal UDB turns to the high level. Furthermore, at the time when the all-selecting signal ALL-ON is at the high level, that is, at the time of the all-selecting drive, the reverse order instruction signal UDB turns to the high level regardless of a logic level of the forward order instruction signal UD.

2.3 Effects

Figure 9:
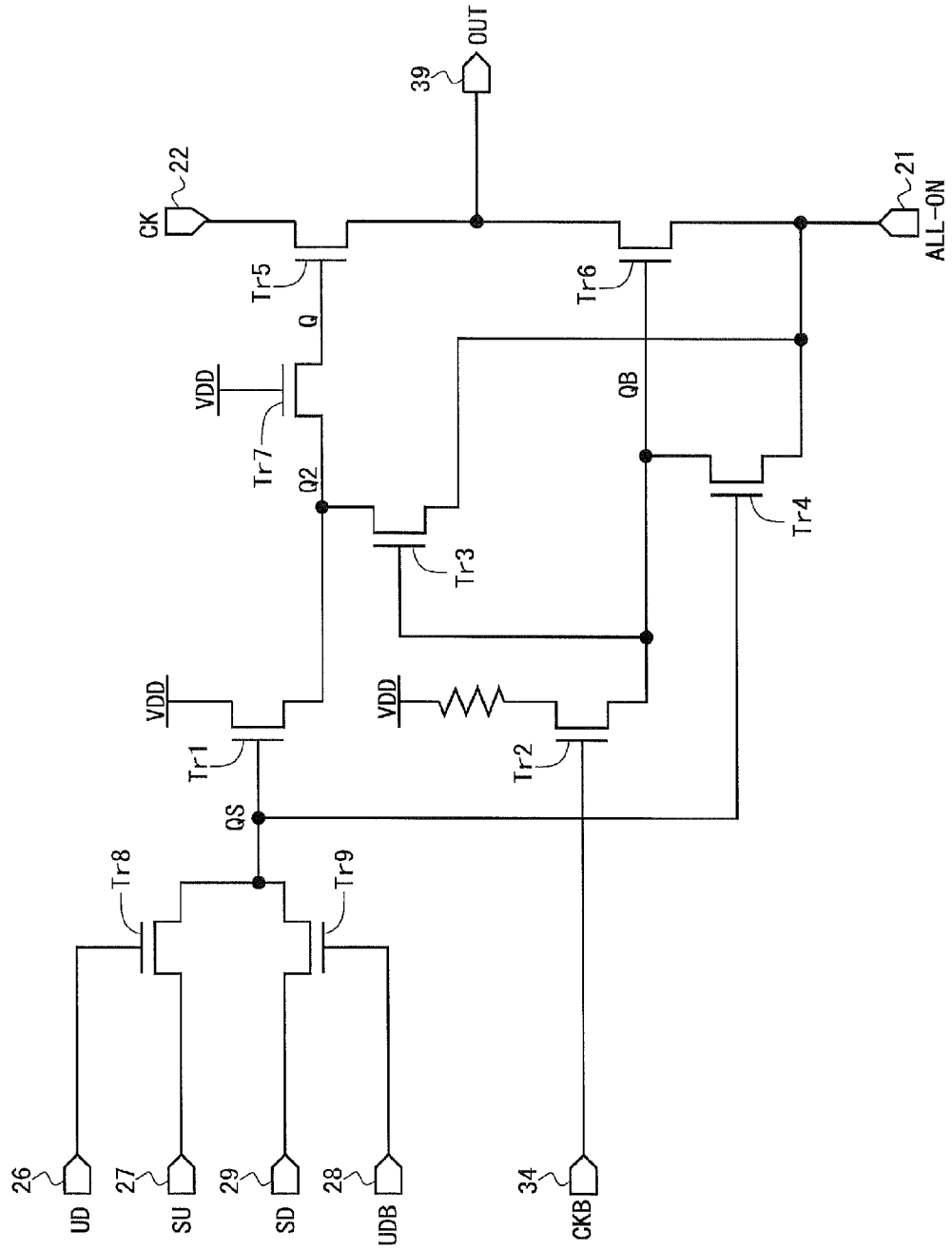
FIG. 9 is a circuit diagram showing a configuration of the stage constituent circuit in a case where a QB node is charged based on a clock signal CKB in the second embodiment.

According to the present embodiment, in the liquid crystal display device capable of switching the scanning order of the gate bus lines, it becomes possible to perform the all-selecting drive for the gate bus lines without increasing the number of circuit elements more than heretofore and without lowering the withstand voltage reliability. Note that, in a similar way to the above-described first embodiment, the QB node may be charged based on the clock signal CKB also in the present embodiment (refer to FIG. 9).

3. Third Embodiment

Figure 10:
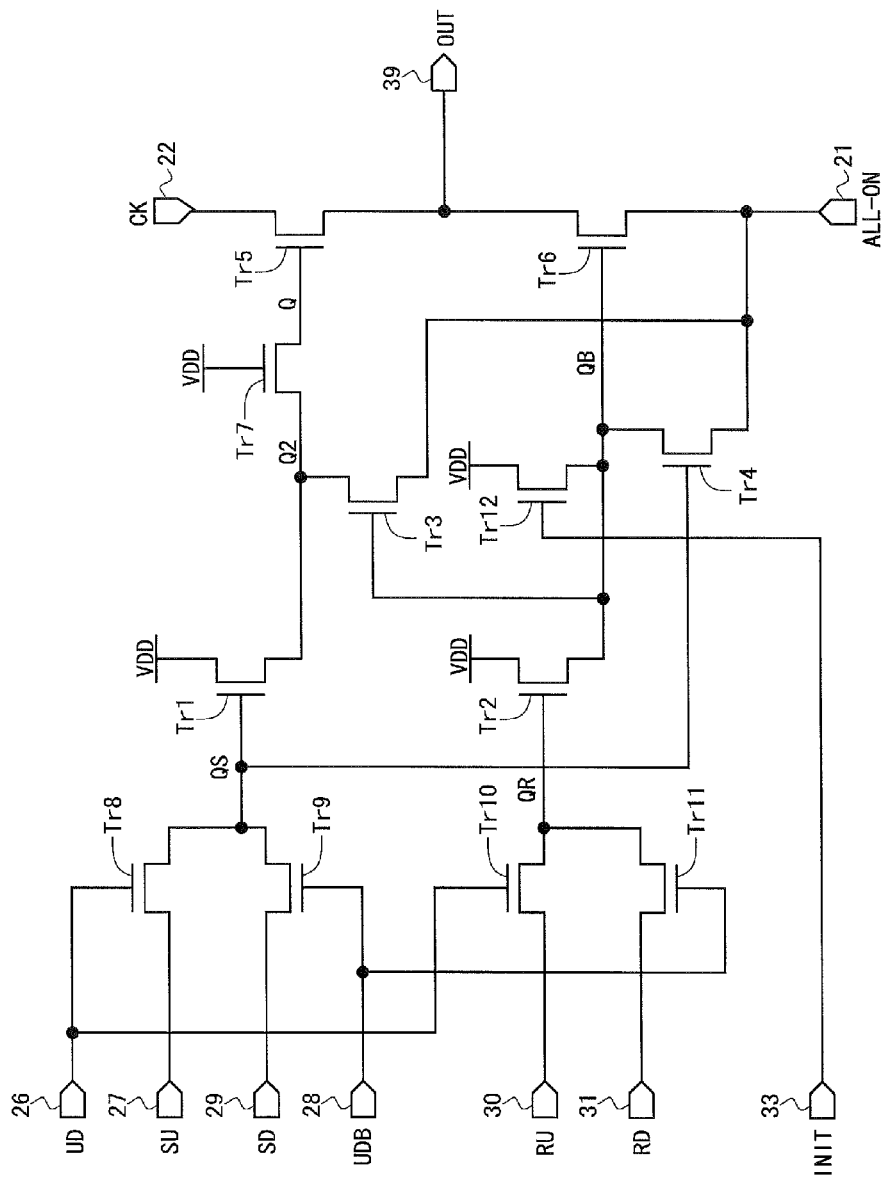
FIG. 10 is a circuit diagram showing a configuration of a stage constituent circuit in a third embodiment of the present invention.

A description is made of a third embodiment of the present invention. In the present embodiment, it is made possible to perform initialization for the shift register 210. FIG. 10 is a circuit diagram showing a configuration of a stage constituent circuit in the present embodiment. As shown in FIG. 10, in the stage constituent circuit in the present embodiment, a thin film transistor Tr12 and an input terminal 33, which serve for inactivating the stage constituent circuit, are provided in addition to the constituent elements in the above-described second embodiment (refer to FIG. 7). Note that an initialization switching element is realized by the thin film transistor Tr12. With regard to the thin film transistor Tr12, a gate terminal thereof is connected to the input terminal 33 for receiving an initialization signal INIT, a drain terminal thereof is connected to the input terminal for the high-potential power supply, and a source terminal thereof is connected to the QB node. Note that all of the stage constituent circuits, which constitute the shift register 210, are given the initialization signal INIT common thereto. In such a configuration, the initialization signal INIT is set at the high level, for example, immediately after the power supply of the device is turned ON. In this way, the thin film transistor Tr12 turns to the ON state, and the potential of the QB node turns to the high level. When the potential of the QB node turns to the high level, the thin film transistor Tr3 turns to the ON state, and accordingly, the potential of the Q2 node and the potential of the Q node turn to the low level. In such a way as described above, the potential of the Q2 node turns to the low level, and the potential of the QB node turns to the high level. As described above, in the present embodiment, the initialization signal INIT is set at the high level, whereby all of the stage constituent circuits, which constitute the shift register 210, can be inactivated.

In such a configuration as described above, the potential of the QB node becomes significantly high at the time of the all-selecting drive in a similar way to the above-described first embodiment. That is to say, the potential of the QB node becomes higher than VDD. Therefore, if the initialization signal INIT is at the low level, then it is apprehended that the voltage, which exceeds the withstand voltage, may be applied between the gate and source of the thin film transistor Tr12. Accordingly, in the present embodiment, during the period in which the all-selecting signal ALL-ON is maintained at the high level, the initialization signal INIT is set at the high level. In this way, application of the voltage exceeding the withstand voltage to the thin film transistor Tr12 is suppressed.

Figure 11:
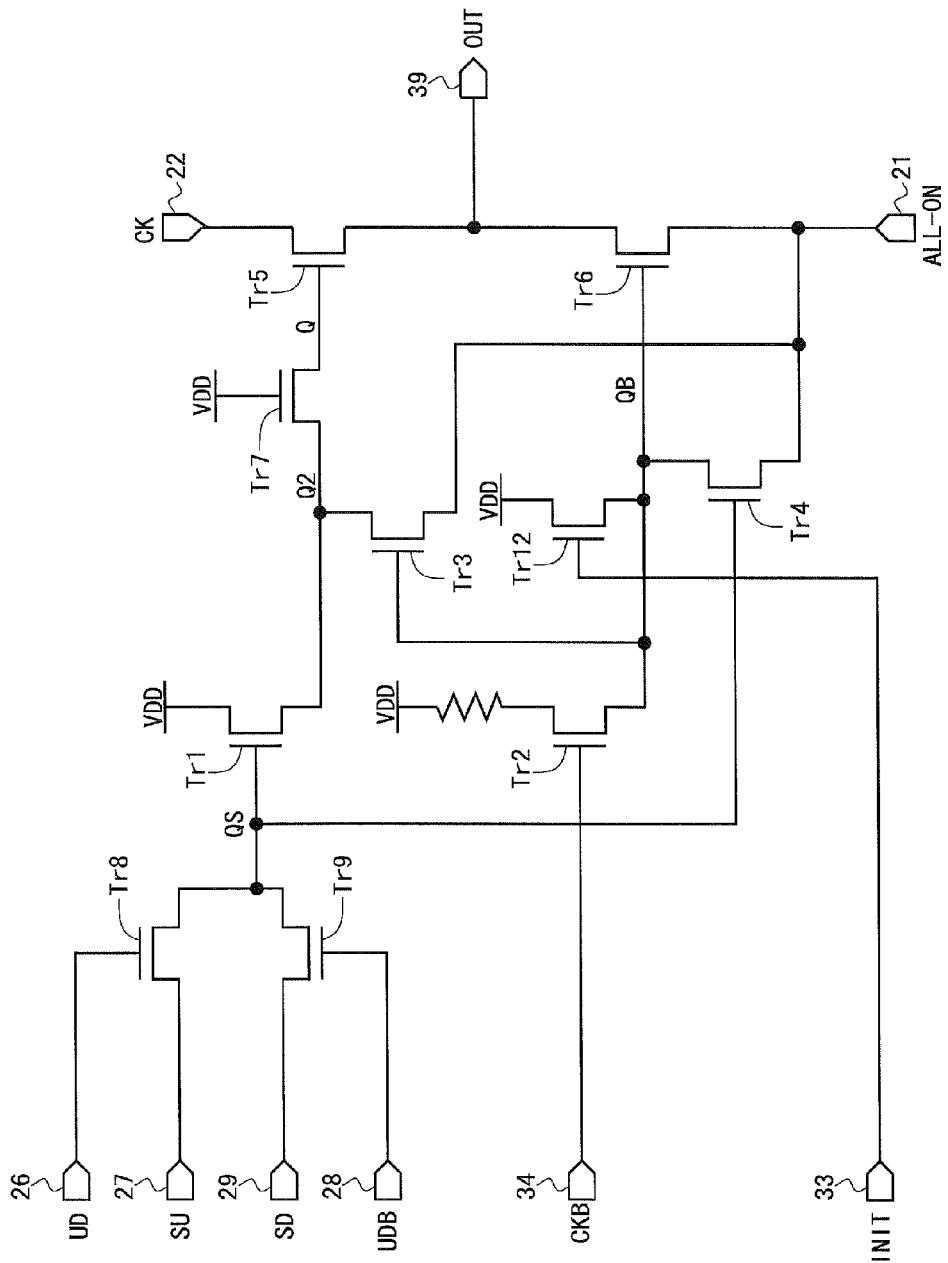
FIG. 11 is a circuit diagram showing a configuration of the stage constituent circuit in a case where a QB node is charged based on a clock signal CKB in the third embodiment.

Note that, in a similar way to the above-described first and second embodiments, the QB node may be charged based on the clock signal CKB also in the present embodiment (refer to FIG. 11).

4. Modification Example, and the Like

4.1 Regarding Type of Thin Film Transistor

Figure 12:
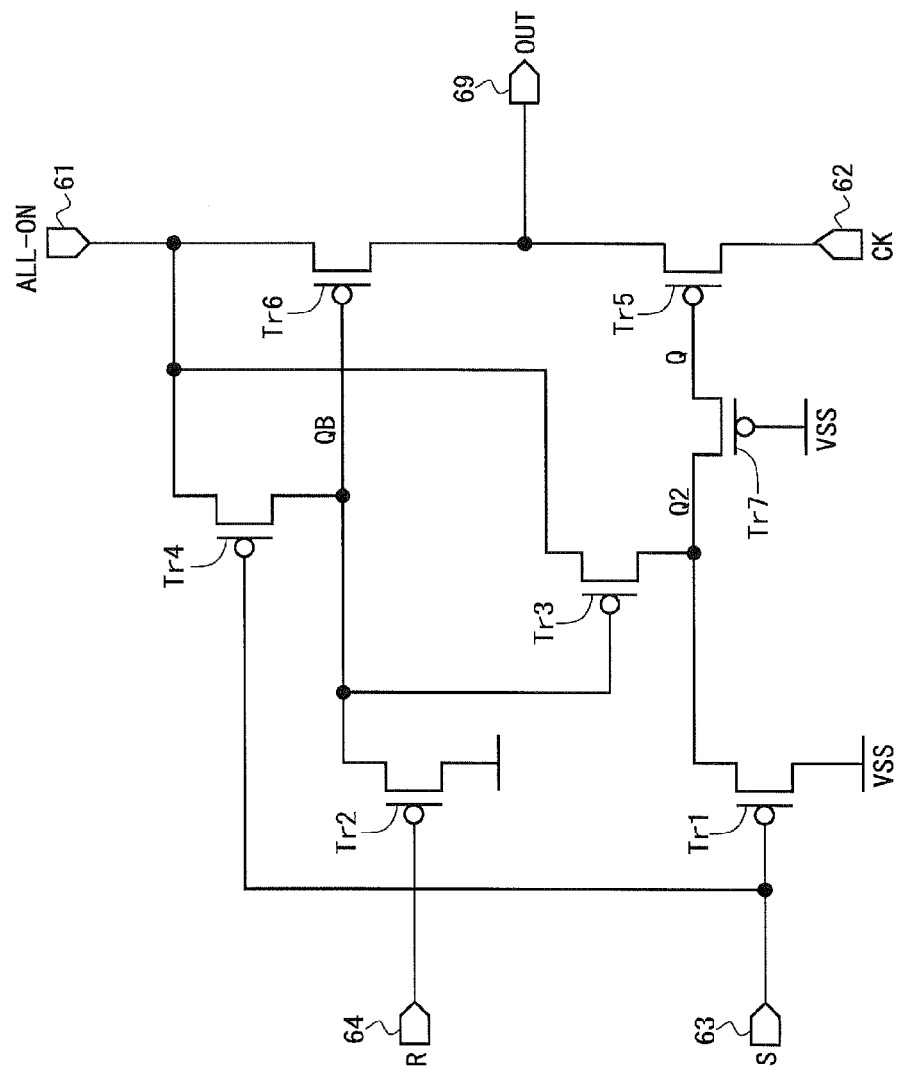
FIG. 12 is a circuit diagram showing a configuration example of the stage constituent circuit in a case of using p-channel type transistors.
Figure 13:
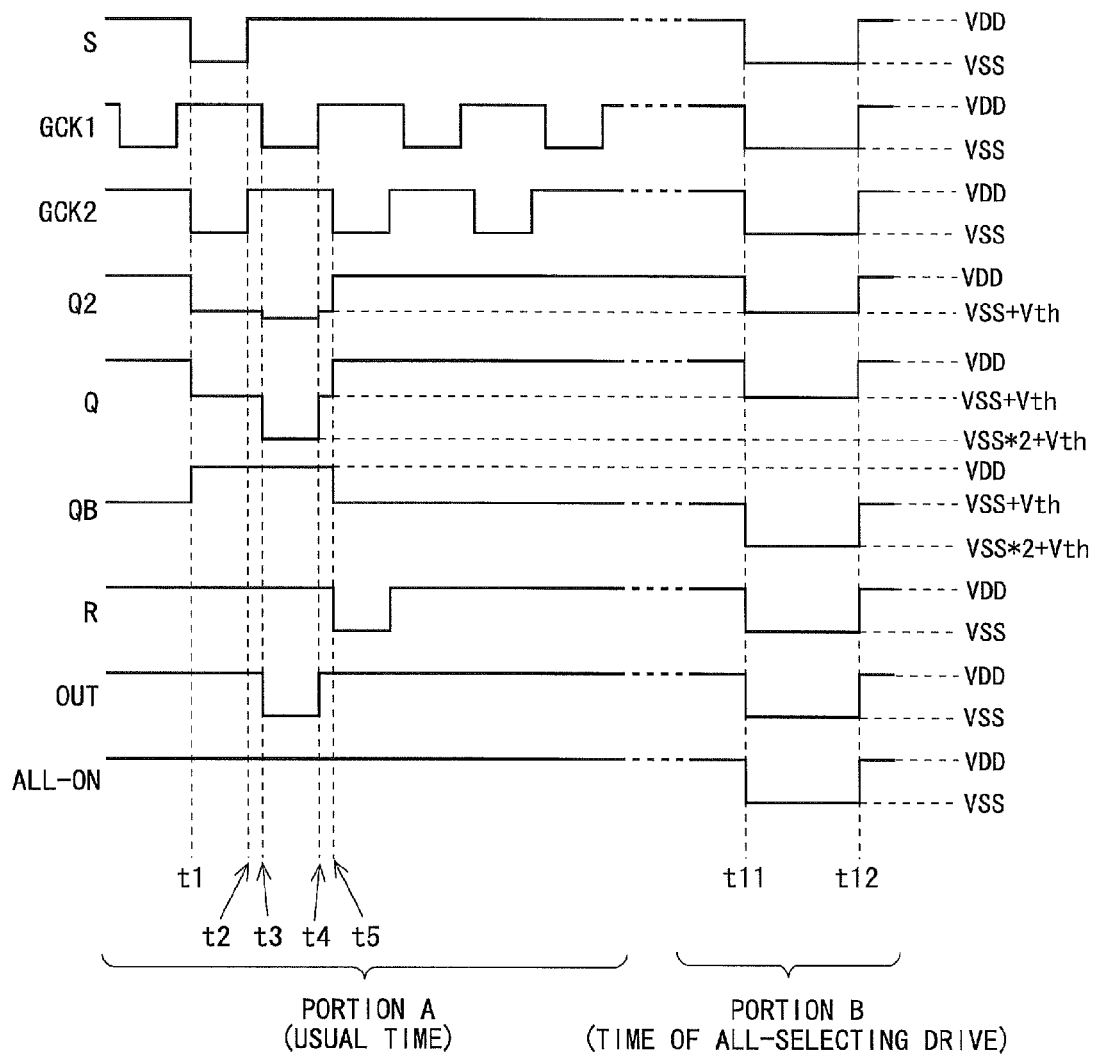
FIG. 13 is a signal waveform chart for explaining an operation of the stage constituent circuit in the case of using the p-channel type transistors.

Each of the above-described embodiments is described while exemplifying the case where the thin film transistors in each of the stage constituent circuits are n-channel type transistors; however, the present invention is not limited to this. When the power supplies (high potential/low potential) and the signal logics (high/low) are reversed from those of each of the above-described embodiments, p-channel type transistors can also be employed as the thin film transistors in each of the stage constituent circuits. For example, in a case where a circuit equivalent to the stage constituent circuit shown in FIG. 1 is realized by using the p-channel type transistor, a circuit configuration thereof is as shown in FIG. 12. In this case, at the time of the all-selecting drive, the all-selecting signal ALL-ON is changed from the high level to the low level as shown in FIG. 13. At this time, the potential of the QB node is lowered to a significantly low level by the boot strap caused by the parasitic capacitance of the thin film transistor Tr6. In this way, the potential of the output terminal 69 (the potential of the scanning signal OUT) is lowered to the potential of the all-selecting signal ALL-ON without causing the so-called threshold voltage drop. Such operations are performed for all of the stage constituent circuits, and all of the gate bus lines turn to the selected state during the period from the point of time t11 to the point of time t12. Note that, in this modification example, the high-potential power supply corresponds to the first-potential power supply, and the low-potential power supply corresponds to the second-potential power supply.

4.2 Regarding Entire Configuration of Liquid Crystal Panel

Figure 14:
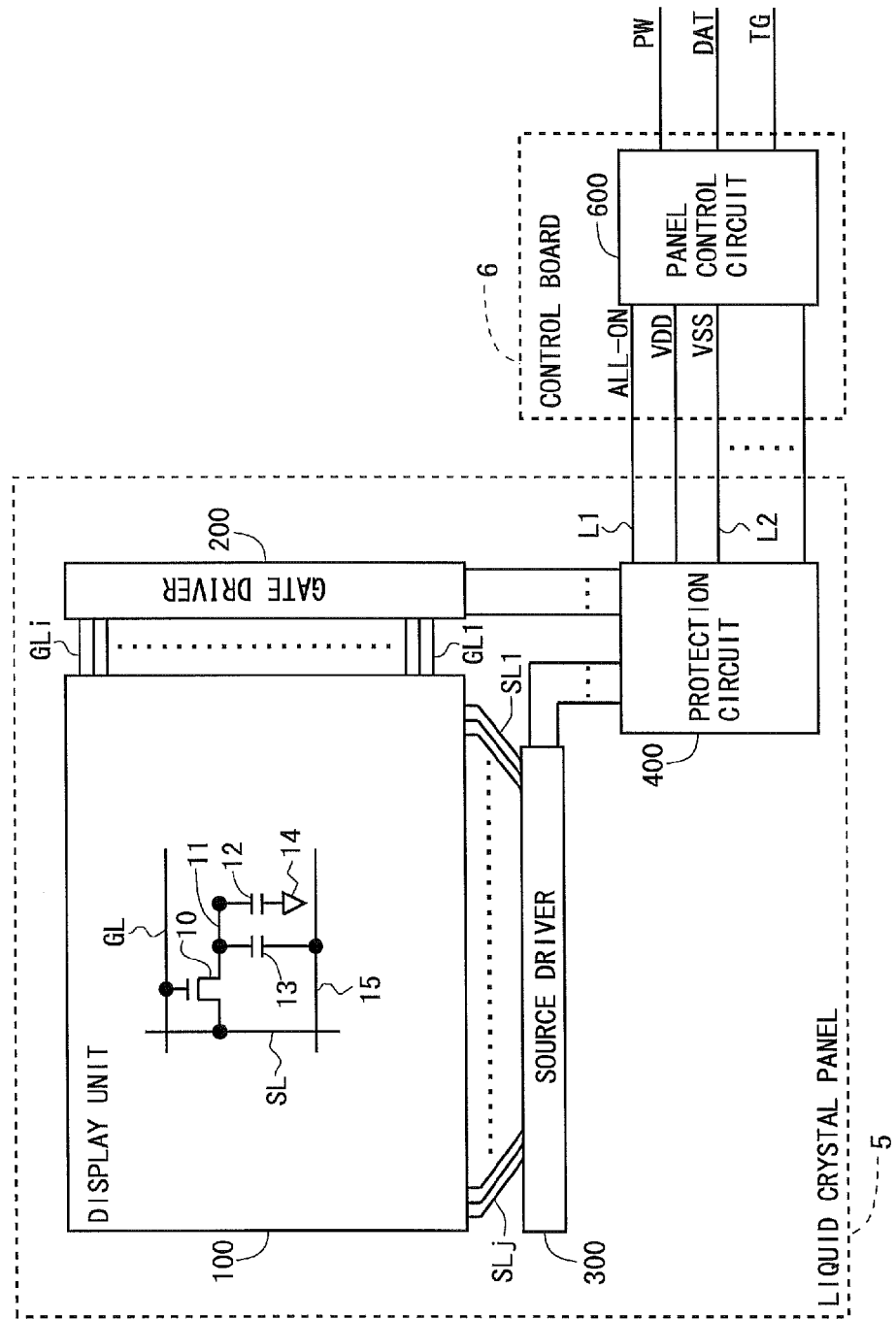
FIG. 14 is a view showing a modification example of an entire configuration of a liquid crystal panel.

In the above description, the configuration (refer to FIG. 2) in which the control circuits 501 and 502 are provided between the protection circuit 400 and the gate driver 200 and between the protection circuit 400 and the source driver 300 is illustrated; however, the present invention is not limited to this. As shown in FIG. 14, the present invention can also be applied to a case where the control circuits independent of the gate driver 200 and the source driver 300 are not provided in the liquid crystal panel 5. However, also in this case, the ALL-ON wiring L1 and the VSS wiring L2 are set in the state of being electrically separated from each other, and only the low-potential power supply input terminal of the gate driver 200 is connected to the ALL-ON wiring L1.

4. 3 Regarding Timing when All-Selecting Drive is Performed

<4. 3. 1 First Case>

As typical timing when the all-selecting drive is performed, an event where the power supply of the device is turned OFF and an event where the power supply of the device is turned ON are mentioned. That is to say, typically, the all-selecting drive is incorporated in a power supply-OFF sequence (series of processing executed when the power supply is turned OFF) or a power supply-ON sequence (series of processing executed when the power supply is turned ON).

As shown in FIG. 2, the panel control circuit 600 receives the supply of the power supply PW from the outside. During a period in which the panel control circuit 600 is receiving the supply of the power supply PW from the outside, the panel control circuit 600 maintains the all-selecting signal ALL-ON at the low level. Meanwhile, when the supply of the power supply PW from the outside is started or shut off, the panel control circuit 600 sets the all-selecting signal ALL-ON at the high level (ON level). The all-selecting drive is performed when the device is started up or shut down in such away as described above, and the residual electric charges in all of the pixel formation portions in the display unit are removed.

<4.3.2 Second Case>

Figure 15:
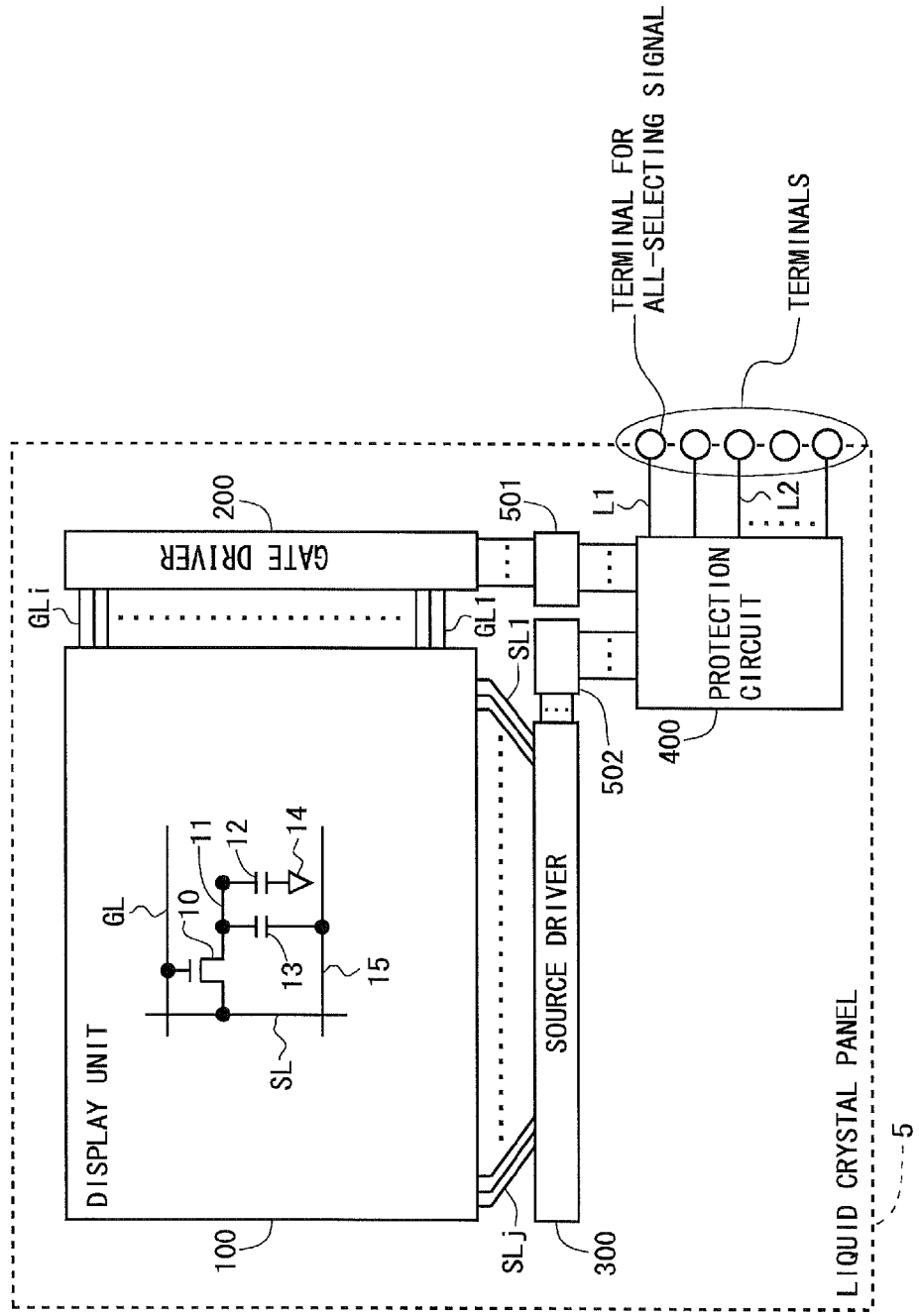
FIG. 15 is a view for explaining an example where an all-selecting drive is performed at the time of an inspection of the liquid crystal panel.

The all-selecting drive may be performed at the time of inspecting the liquid crystal panel 5. For example, in various inspections for the liquid crystal panel 5, desirably, the residual electric charges in the pixel formation portions are not allowed to affect an inspection result. In such a case, the high-level potential is given to the terminal (refer to FIG. 15) for the all-selecting signal ALL-ON among the terminals provided in the liquid crystal panel 5, whereby the residual electric charges in all of the pixel formation portions in the display unit are removed. Moreover, the inspection can be performed without inputting a clock and the like, and accordingly, the inspection can be performed simply.

DESCRIPTION OF REFERENCE CHARACTERS

5: LIQUID CRYSTAL PANEL
100: DISPLAY UNIT
200: GATE DRIVER
210: SHIFT REGISTER
400: PROTECTION CIRCUIT
600: PANEL CONTROL CIRCUIT
Tr1 TO Tr12: THIN FILM TRANSISTOR
ALL-ON: ALL-SELECTING SIGNAL
CK: CLOCK SIGNAL
OUT: SCANNING SIGNAL
S: SET SIGNAL
R: RESET SIGNAL

The invention claimed is:

1. A display device comprising a display panel which includes a display unit in which a plurality of scanning signal lines and a plurality of video signal lines are arranged, a scanning signal line drive circuit that drives the plurality of scanning signal lines, and a video signal line drive circuit that drives the plurality of video signal lines, wherein the display panel includes: a first first-potential power supply wiring for supplying a first-potential power supply to the scanning signal line drive circuit; and a second first-potential power supply wiring for supplying the first-potential power supply to circuits other than the scanning signal line drive circuit, the scanning signal line drive circuit includes a shift register made of a plurality of stages for sequentially outputting ON-level scanning signals to the plurality of scanning signal lines based on a clock signal, a stage constituent circuit that constitutes each of the stages of the shift register includes:
an output node connected to one of the scanning signal lines;
an output control node for controlling a potential of a scanning signal outputted from the output node; and
an output control node turn-off switching element in which a second electrode is connected to the output control node and a third electrode is connected to the first first-potential power supply wiring, the output control node turn-off switching element serving for changing a potential of the output control node toward an OFF level based on a potential of a first electrode, the output control node is configured to be capable of being given a potential higher than a potential of a second-potential power supply supplied to the scanning signal line drive circuit in a case where the potential of the second-potential power supply supplied to the scanning signal line drive circuit is higher than a potential of the first-power supply supplied to the scanning signal line drive circuit, the output control node is configured to be capable of being given a potential lower than the potential of the second-potential power supply supplied to the scanning signal line drive circuit in a case where the potential of the second-potential power supply supplied to the scanning signal line drive circuit is lower than the potential of the first-power supply supplied to the scanning signal line drive circuit, and the first first-potential power supply wiring and the second first-potential power supply wiring are power supply wirings independent of each other.

2. The display device according to claim 1,
wherein the stage constituent circuit includes:
an output node turn-off switching element in which a second electrode is connected to the output node and a third electrode is connected to the first first-potential power supply wiring, the output node turn-off switching element serving for changing a potential of the output node toward the OFF level based on the potential of a first electrode;
a first control node connected to the first electrode of the output node turn-off switching element, the first control node serving as the output control node;
a first control node turn-on portion for changing a potential of the first control node toward the ON level; and
a first control node turn-off switching element in which a second electrode is connected to the first control node and a third electrode is connected to the first first-potential power supply wiring, the first control node turn-off switching element serving for changing the potential of the first control node toward the OFF level based on a potential of a first electrode, and serving as the output control node turn-off switching element.

3. The display device according to claim 2,
wherein the stage constituent circuit further includes:
an output node turn-on switching element in which a second electrode is given the clock signal and a third electrode is connected to the output node, the output node turn-on switching element serving for changing the potential of the output node toward the ON level based on a potential of a first electrode;
a second control node connected to the first electrode of the output node turn-on switching element, the second control node serving as the output control node;
a second control node turn-on portion for changing a potential of the second control node toward the ON level; and
a second control node turn-off switching element in which a second electrode is connected to the second control node directly or through voltage dividing means and a third electrode is connected to the first first-potential power supply wiring, the second control node turn-off switching element serving for changing the potential of the second control node based on a potential of a first electrode, and serving as the output control node turn-off switching element, and
the first electrode of the second control node turn-off switching element is connected to the first control node.

4. The display device according to claim 3,
wherein the scanning signal line drive circuit is configured to be capable of an all-selecting drive of outputting the ON-level scanning signals to all of the plurality of scanning signal lines,
an all-selecting signal controlling whether or not to perform the all-selecting drive is given to the first first-potential power supply wiring,
the second control node turn-on portion included in the stage constituent circuit changes the potential of the second control node toward the ON level based on a start instruction signal or a scanning signal outputted from the output node on a preceding stage,
the start instruction signal or the scanning signal outputted from the output node on the preceding stage is given to the first electrode of the first control node turn-off switching element included in the stage constituent circuit, and
the all-selecting signal, the clock signal and the start instruction signal are set at the ON level at a time of the all-selecting drive.

5. The display device according to claim 3, wherein the stage constituent circuit includes, as the voltage dividing means, a voltage-dividing switching element in which a first electrode is given a high-potential power supply, a second electrode of the second control node turn-off switching element is connected to a second electrode, and the first electrode of the output node turn-on switching element is connected to a third electrode.

6. The display device according to claim 3,
wherein the shift register is configured so that an order of giving the plurality of scanning signal lines the ON-level scanning signals can be switched between a forward order and a reverse order,
the stage constituent circuit is given a switching control signal which is changed between the ON level and the OFF level, the switching control signal serving for switching the order of giving the plurality of scanning signal lines the ON-level scanning signals,
the second control node turn-on portion included in the stage constituent circuit is composed of:
a second control node turn-on switching element in which a second electrode is given a high-potential power supply and a third electrode is connected to the second control node directly or through the voltage dividing means, the second control node turn-on switching element serving for changing the potential of the second control node toward the ON level based on a potential of a first electrode;
a fourth control node connected to the first electrode of the second control node turn-on switching element; and
a second switch-control switching element in which a first electrode is given the switching control signal, a second electrode is given a scanning signal outputted from the output node of other stage, and a third electrode is connected to the fourth control node, and
a signal line for giving the switching control signal an OFF-level potential is connected to the first first-potential power supply wiring.

7. The display device according to claim 6,
wherein the first control node turn-on portion included in the stage constituent circuit is composed of:
a first control node turn-on switching element in which a second electrode is given the high-potential power supply and a third electrode is connected to the first control node, the first control node turn-on switching element serving for changing the potential of the first control node toward the ON level based on a potential of a first electrode;
a third control node connected to the first electrode of the first control node turn-on switching element; and
a first switch-control switching element in which a first electrode is given the switching control signal, a second electrode is given a scanning signal outputted from the output node of other stage, and a third electrode is connected to the third control node.

8. The display device according to claim 6,
wherein the scanning signal line drive circuit is configured to be capable of an all-selecting drive of outputting the ON-level scanning signals to all of the plurality of scanning signal lines,
an all-selecting signal controlling whether or not to perform the all-selecting drive is given to the first first-potential power supply wiring, and
the all-selecting signal and the switching control signal are set at the ON level at a time of the all-selecting drive.

9. The display device according to claim 2, wherein the stage constituent circuit further includes an initialization switching element configured so that a second electrode is given a high-potential power supply, that a third electrode is connected to the first control node, and that a first electrode is given a predetermined initialization signal.

10. The display device according to claim 9,
wherein the scanning signal line drive circuit is configured to be capable of an all-selecting drive of outputting the ON-level scanning signals to all of the plurality of scanning signal lines,
an all-selecting signal controlling whether or not to perform the all-selecting drive is given to the first first-potential power supply wiring, and
the all-selecting signal and the initialization signal are set at the ON level at a time of the all-selecting drive.

11. The display device according to claim 1,
wherein the scanning signal line drive circuit is configured to be capable of an all-selecting drive of outputting the ON-level scanning signals to all of the plurality of scanning signal lines,
an all-selecting signal controlling whether or not to perform the all-selecting drive is given to the first first-potential power supply wiring, and
the all-selecting signal is set at the ON level at a time of the all-selecting drive.

12. The display device according to claim 11, wherein the all-selecting drive is performed at a time of inspecting the display panel.

13. The display device according to claim 11, further comprising:
a panel control circuit connected to the first first-potential power supply wiring, the panel control circuit serving for controlling an operation of the display panel,
wherein the panel control circuit sets the all-selecting signal at the ON level when a supply of a power supply from an outside is started or shut off.

* * * * *